United States Patent
Nagumo

(10) Patent No.: US 8,093,828 B2
(45) Date of Patent: Jan. 10, 2012

(54) DRIVE CIRCUIT, LIGHT EMITTING DIODE HEAD, AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 508 days.

(21) Appl. No.: 12/379,655

(22) Filed: Feb. 26, 2009

(65) Prior Publication Data

US 2009/0243512 A1 Oct. 1, 2009

(30) Foreign Application Priority Data

Mar. 25, 2008 (JP) ................. 2008-079252

(51) Int. Cl.
*G05F 1/00* (2006.01)
(52) U.S. Cl. ........ 315/291; 315/226; 315/224; 315/294; 327/108; 327/561; 347/237; 347/247
(58) Field of Classification Search .............. 315/291, 315/294, 216, 224, 226, 169.1–169.3, 312; 327/108, 109, 561, 590; 347/237, 238, 247
See application file for complete search history.

(56) References Cited

U.S. PATENT DOCUMENTS

| 5,248,906 | A  | * | 9/1993  | Mahmood       | 326/27    |
| 6,345,062 | B1 | * | 2/2002  | Taguchi et al.| 372/38.01 |
| 6,388,695 | B1 | * | 5/2002  | Nagumo        | 347/237   |
| 6,529,229 | B2 | * | 3/2003  | Nagumo        | 347/237   |
| 7,742,019 | B2 | * | 6/2010  | Takahara      | 345/76    |
| 7,821,211 | B2 | * | 10/2010 | Nagumo        | 315/291   |

FOREIGN PATENT DOCUMENTS

JP      09-291550    11/1997

* cited by examiner

*Primary Examiner* — Haiss Philogene
(74) *Attorney, Agent, or Firm* — Kubotera & Associates, LLC

(57) ABSTRACT

A drive circuit includes a drive element for supplying a drive current to a driven element; a control voltage generation circuit for outputting a control voltage to the drive element to generate the drive current through inputting a reference voltage; and a switch section for shutting down the reference voltage when the driven element is not driven so that the control voltage decreases to a level not to generate the drive current.

12 Claims, 19 Drawing Sheets

US 8,093,828 B2

DRIVE CIRCUIT, LIGHT EMITTING DIODE HEAD, AND IMAGE FORMING APPARATUS

BACKGROUND OF THE INVENTION AND RELATED ART STATEMENT

The present invention relates to a drive circuit for driving a group of driven elements such as, for example, an array of light emitting diodes (LEDs) disposed in an electro-photography printer as a light source, an array of heating resistors disposed in a thermal printer, and an array of display units disposed in a display device. The present invention also relates to a light emitting diode (LED) head including the drive circuit; and an image forming apparatus including the light emitting diode (LED) head.

In the specification, a light emitting diode may be referred to as an LED; a monolithic integrated circuit may be referred to as an IC; an n-channel MOS (Metal Oxide Semiconductor) transistor may be referred to as an NMOS transistor; and a p-channel MOS transistor may be referred to as a PMOS transistor.

Further, a high signal level may be referred to as a logical value of one (1), and a low signal level may be referred to as a logical value of zero (0), regardless of a positive logic or a negative logic. When it is necessary to differentiate the positive logic and the negative logic in a logical signal, "–P" may be added to an end of a positive logical signal, and "–N" may be added to an end of a negative logical signal.

In the following description, a group of driven elements is an array of LEDs used in an electro-photography printer as an example.

In a conventional image forming apparatus such as an electro-photography printer., a plurality of light emitting elements is arranged to form an exposure device. The light emitting element includes an organic EL and a light emitting thyristor, in addition to the light emitting diode (LED).

When the light emitting diode is used as a light source, a drive circuit is disposed to correspond to the light emitting element with each other, or to an N number of the light emitting elements (N>1). The light emitting element is switched between a turned-on state and a turned-off state when a current flows or stops flowing between an anode terminal and a cathode terminal thereof. When the LED emits light, a luminous output is determined by a drive current value. Accordingly, it is possible to adjust an exposure energy value of the exposure device through adjusting the drive current.

Patent Reference has disclosed a conventional drive circuit. In the conventional drive circuit, a first MOS transistor and a second MOS transistor constitute a series connection circuit. One of the first MOS transistor and the second MOS transistor operates in a saturated region all the time, thereby providing a constant current property for driving an LED with a constant current. Patent Reference: Japanese Patent Publication No. 09-291550 As described above, in the conventional LED drive circuit disclosed in Patent Reference, the first MOS transistor and the second MOS transistor constitute the series connection circuit. The first MOS transistor operates in the saturated region all the time, thereby providing the constant current property. The second MOS transistor is switching for controlling the drive of the LED. A control voltage is always supplied to a gate terminal of the first MOS transistor according to the drive current value to operate in the saturated region all the time, so that a drain terminal thereof is charged at a potential substantially the same as a power source potential.

Accordingly, when a drive on instruction signal is input to a gate terminal of the second MOS transistor, the second MOS transistor is turned on. As a result, the charged potential is discharged through the second MOS transistor and the LED without any control, thereby causing a sharp peak in a current waveform of the LED. The peak thus created has a current value depending on a small wiring resistivity inside the drive circuit, and the current value is significant enough to deteriorate the LED, thereby reducing a lifetime thereof.

The conventional drive circuit will be explained in more detail with reference to FIG. 19. FIG. 19 is a circuit diagram showing the conventional LED drive circuit. FIG. 19 shows a connection relationship of the LED drive circuit and a peripheral circuit thereof, and schematically represents one dot (for example, a surrounding area of the drive circuit of an LED element LED1).

As shown in FIG. 19, the conventional LED drive circuit includes a driver IC 81 represented with a hidden line; an LED array portion 82; a control voltage generation circuit 83 represented with a projected line; and a latch circuit 84 for one element. In the conventional LED drive circuit, the driver IC 81 has 192 of drive output terminals, so that there are provided 192 of the latch circuits 84, 192 of PMOS transistors 85 (described later), 192 of PMOS transistors 86 (described later), and the likes. On the other hand, the conventional LED drive circuit includes one control voltage generation circuit 83 per one driver IC 81.

In the conventional LED drive circuit, a source terminal of the PMOS transistor 85 is connected to a power source VDD, and a drain terminal thereof is connected to a source terminal of the PMOS transistor 86. A drain terminal of the PMOS transistor 86 is connected to a drive output terminal of a driver IC (not shown), and further connected to an anode terminal of the LED element LED1 of the LED array 82.

In the conventional LED drive circuit, an input terminal D of the latch circuit 84 is connected to an output terminal of a shift register (not shown), and an input terminal G thereof is connected to a latch signal HD-LOAD. An output terminal Q of the latch circuit 84 is connected to one of input terminals of an NAND gate 87, and an output terminal of the NAND gate 87 is connected to a gate terminal of the PMOS transistor 86. A strobe signal (not shown) is input into an input terminal of an inverter circuit 88, and an output terminal of the inverter circuit 88 is connected to the other of the input terminals of the NAND gate 87. A gate terminal of the PMOS transistor 85 is connected to an output terminal of an operational amplifier 89 (described later).

In the control voltage generation circuit 83, the operational amplifier 89 outputs an output voltage Vcon. The control voltage generation circuit 83 further includes a resistor 90 having a resistivity Rref and a PMOS transistor 91 having a gate length the same as that of the PMOS transistor 85. A reference voltage terminal VREF is connected to an inverse input terminal of the operational amplifier 89, and a reference voltage Vref is input to the reference voltage terminal VREF from a reference voltage circuit (not shown).

A source terminal of the PMOS transistor 91 is connected to the power source VDD, and a gate terminal thereof is connected to the output terminal of the operational amplifier 89. A drain terminal of the PMOS transistor 91 is connected to one end portion of the resistor 90 and a non-inverse input terminal of the operational amplifier 89. The other end portion of the resistor 90 is connected to ground.

The operational amplifier 89, the PMOS transistor 91, and the resistor 90 constitute a feedback control circuit. A current Iref flowing through the resistor 90, that is, the PMOS transistor 91, is not depended on the power source voltage VDD, and is determined only by the reference voltage Vref and the resistivity Rref of the resistor 90. Accordingly, the current Iref is given by:

$$Iref=Vref/Rref$$

In the conventional LED drive circuit, a gate potential of the PMOS transistors 85 and 91 is equal to the voltage Vcont, and the PMOS transistors 85 and 91 have a same source potential. Accordingly, a voltage between the gate terminal and the source terminal of the PMOS transistor 85 is equal to that of the PMOS transistor 91, thereby having a current-mirror relationship. As a result, a current to be flowing in the PMOS transistor 85 is proportional to the current Iref flowing through the resistor 91. Accordingly, it is possible to adjust the drain current of the PMOS transistors 85 and 91 according to the reference voltage Vref, and to control a drive current of the LED element in the LED array 82 at a specific value.

In the conventional LED drive circuit, the PMOS transistor 86 is instructed to turn on according to print data latched with the latch circuit 84. At this time, a drain current generated in the PMOS transistor 86 is determined by a voltage between the gate terminals and the source terminals of the PMOS transistors 91 and 85. Accordingly, the PMOS transistor 86 functions as a switch element for switching the current.

An overshoot waveform of the drive current in the conventional LED drive circuit will be explained next. As shown in FIG. 19, a parasite capacitor 92 is created as a model of a floating capacitor inherently generated in the drain terminal of the PMOS transistor 85.

As described above, the reference voltage Vref is supplied to the control voltage generation circuit 83, and the reference current Iref determined by the reference voltage Vref flows in the PMOS transistor 91. The reference current Iref is dictated by the potential Vcont supplied to the gate terminal of the PMOS transistor 91. The voltage is applied to the gate terminal of the PMOS transistor 85 for tuning on the element.

When the PMOS transistor 86 is in an off state, the the floating capacitor 92 is charged up to a potential substantially the same as the power source voltage VDD. When the LED element LED1 is switched from on to off, the PMOS transistor 86 is switched from on to off. Accordingly, charges accumulated in the floating capacitor 92 are rapidly discharged to the LED element LED1, thereby causing a large overshoot in a waveform of the drive current at a rise portion thereof. When the charges are completely discharged, an anode current of the LED element LED1 has a value according to a drive state of the PMOS transistor 85, thereby leveling the large overshoot of the anode current of the LED element LED1.

FIG. 20 is a time chart showing an operation of the conventional LED drive circuit. In FIG. 20, print data are transferred with a HD-CLK signal and a HD-DATA signal. Then, transfer data are latched with a HD-LOAD signal, so that the LED element is driven with a strobe signal HD-STB-N according to the transferred data. When the strobe signal HD-STB-N rises at a point A, the LED element starts being driven, and a waveform of the drive current shows a large overshoot at a rise portion thereof.

As shown in FIG. 20, the drive current is leveled in a relatively short period of time, and is maintained at a specific value as indicated with a point B. When the strobe signal HD-STB-N becomes off, the drive current returns to zero as indicated with a point C. When the charges accumulated in the floating capacitor 92 shown in FIG. 19 are rapidly discharged toward the LED element through the switch formed of the PMOS transistor 86, the waveform of the drive current shows the large overshoot. The drive current is restricted with a resistor element such as an on resistivity of the PMOS transistor 86, a wiring resistivity inside the LED element, and the likes. The resistor element has a small resistivity, so that a level of the overshoot reaches a value a few tens of times of a designed drive condition of the LED element.

When such an excessive current flows in the LED element, even though it is for a short period of time, a large influence affects on the LED element, thereby deteriorating the LED element and changing a luminous efficiency thereof in a long run. As described above, the overshoot of the drive current is regulated with the resistor element such as the on resistivity of the PMOS transistor 86, the wiring resistivity inside the LED element, and the likes, and it is difficult to accurately control the resistor element. Accordingly, when an LED head includes a plurality of LED elements, each of the LED elements may have a different degree of deterioration after a long period of time, thereby causing a difference in a luminous efficiency thereof and causing an uneven print density.

Further, the conventional drive circuit has a noise voltage problem. More specifically, in the conventional drive circuit, the current waveform has a short rise time and a short fall time. When the drive current flowing in a large number of the LED elements is turned off concurrently in a short period of time, a large noise voltage tends to be generated.

More specifically, the noise voltage is given by:

$$Voltage=L \times \Delta I / \Delta t$$

where $\Delta t$ is the rise time and the fall time of the current waveform, L is an inductance of a peripheral portion of the drive circuit, and $\Delta I$ is a change in the drive current.

When a printer is capable of printing on an A4 size sheet, an LED print head thereof has 4,992 of LEDs. Accordingly, even when the drive current for driving the LEDs is mere 1 mA, a peak current reaches about 5 A when all of the LEDs are turned on.

When the LED elements are turned off, the drive current is zero. When all of the LED elements are turned on, the drive current becomes 5 A, so that the change in the drive current $\Delta I$ becomes 5 A. When such a large current is switched in a short period of time, a large noise voltage is generated, thereby causing malfunction of the drive circuit or even damaging the drive circuit.

In view of the problems described above, an object of the present invention is to provide a drive circuit capable of solving the problems of the conventional drive circuit. In the drive circuit, it is possible to prevent an overshoot in a drive current upon driving an LED element, thereby preventing the LED element from deteriorating. A further object of the present invention is to provide an LED head and an image forming apparatus capable of preventing an uneven print density due to the overshoot. Further, an object of the present invention is to provide a drive circuit, and LED head, and an image forming apparatus capable of reducing a noise voltage.

Further objects and advantages of the invention will be apparent from the following description of the invention.

SUMMARY OF THE INVENTION

In order to attain the objects described above, according to a first aspect of the present invention, a drive circuit includes a drive element for supplying a drive current to a driven element; a control voltage generation circuit for outputting a control voltage to the drive element to generate the drive current through inputting a reference voltage; and a switch section for shutting down the reference voltage when the driven element is not driven so that the control voltage decreases to a level not to generate the drive current.

According to a second aspect of the present invention, an LED head includes a drive circuit. The drive circuit includes a drive element for supplying a drive current to a driven element; a control voltage generation circuit for outputting a control voltage to the drive element to generate the drive current through inputting a reference voltage; and a switch section for shutting down the reference voltage when the driven element is not driven so that the control voltage decreases to a level not to generate the drive current.

According to a third aspect of the present invention, an image forming apparatus includes a drive circuit. The drive circuit includes a drive element for supplying a drive current to a driven element; a control voltage generation circuit for outputting a control voltage to the drive element to generate the drive current through inputting a reference voltage; and a switch section for shutting down the reference voltage when the driven element is not driven so that the control voltage decreases to a level not to generate the drive current.

In the present invention, the switch section is provided for shutting down the reference voltage when the driven element is not driven. Accordingly, the drive current does not flow in the driven element. As a result, when the driven element is not driven, a parasite capacitor is not charged, and when the driven element is driven, an overshoot in the drive current does not occur.

BRIEF DESCRIPTION OF THE DRAWINGS

FIGS. 8(a) and 8(b) are circuit diagrams showing an operation of a control voltage generation circuit according to the first embodiment of the present invention, wherein FIG. 8(a) is a circuit diagram showing an operation of the control voltage generation circuit when an LED is driven, and FIG. 8(b) is a circuit diagram showing an operation of the control voltage generation circuit when the LED is not driven;

FIGS. 11(a) and 11(b) are circuit diagrams showing an operational amplifier according to the second embodiment of the present invention, wherein FIG. 11(a) is a circuit diagram showing a circuit symbol of the operational amplifier, and FIG. 11(b) is a circuit diagram showing a configuration of the operational amplifier;

FIGS. 12(a) and 12(b) are circuit diagrams showing an operation of the operational amplifier according to the second embodiment of the present invention, wherein FIG. 12(a) is a circuit diagram showing an operation of the operational amplifier when an LED is driven, and FIG. 12(b) is a circuit diagram showing an operation of the operational amplifier when the LED is not driven;

DETAILED DESCRIPTION OF PREFERRED EMBODIMENTS

Figure 1:
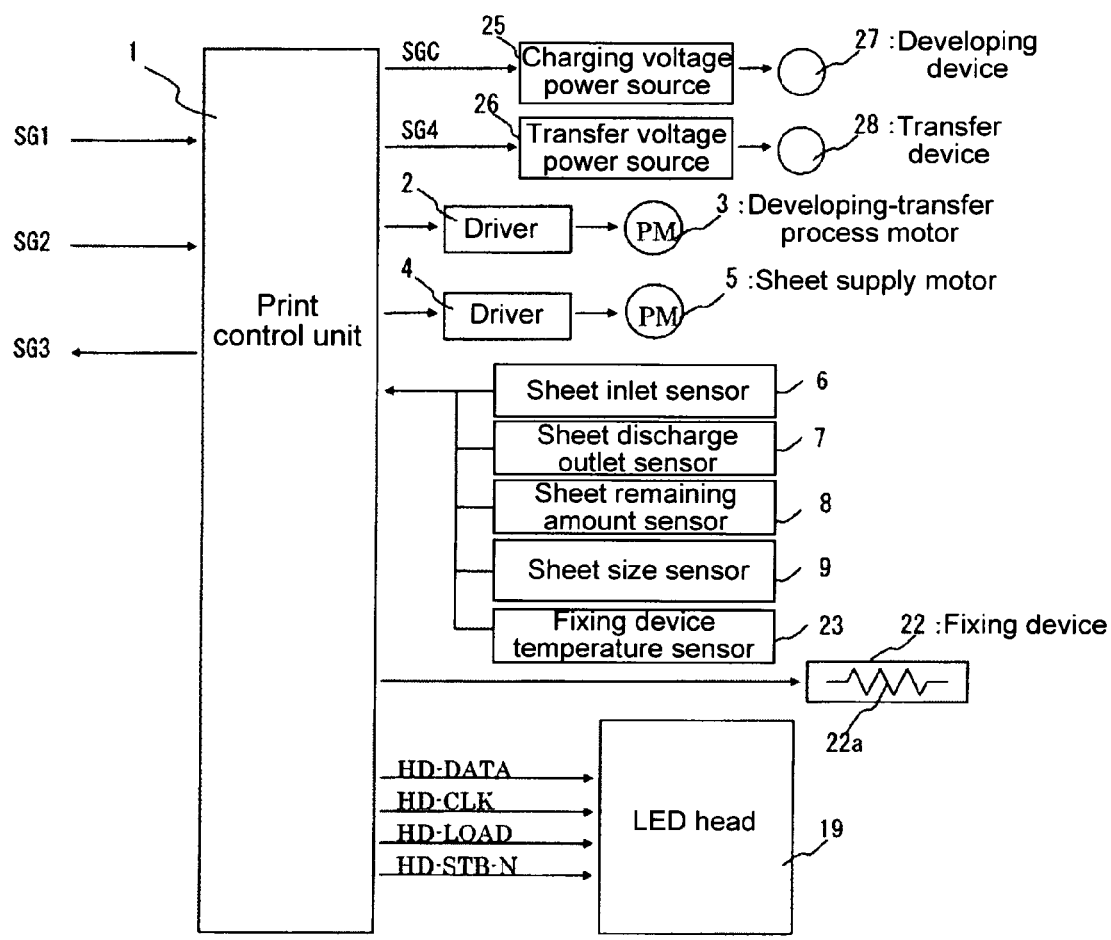
FIG. 1 is a block diagram showing a configuration of an electro-photography printer according to a first embodiment of the present invention.

Hereunder, preferred embodiments of the present invention will be explained with reference to the accompanying drawings. Similar components in the drawings are designated with the same reference numerals.

First Embodiment

A first embodiment of the present invention will be explained. FIG. 1 is a block diagram showing a configuration of an electro-photography printer according to the first embodiment of the present invention.

In the embodiment, the electro-photography printer will be explained as an image forming apparatus. In the electro-photography printer, a charged photosensitive drum is selectively irradiated according to print information to form a static latent image. Then, toner is attached to the static latent image to form a toner image, and the toner image is transferred and fixed to a sheet.

As shown in FIG. 1, the electro-photography printer includes a print control unit 1 formed of a microprocessor, an RAM, an ROM, an input-output port, a timer, and the likes. The print control unit 1 is disposed in a printing unit of the electro-photography printer for performing a sequence control of an entire portion of the electro-photography printer and a printing operation according to a control signal SG1, a video signal SG2 (in which dot map data are arranged one-dimensionally), and the likes from an upper controller (not shown).

When the print control unit 1 receives a print direction along with the control signal SG1, the print control unit 1 first detects whether a fixing device 22 with a heater 22a disposed therein is within an operable temperature range using a fixing device temperature sensor 23. When the fixing device 22 is not within the operable temperature range, the print control unit 1 energizes the heater 22a to heat the fixing device 22 up to an operable temperature.

In the next step, the print control unit 1 controls a developing-transfer process motor (PM) 3 to rotate through a driver 2. At the same time, the print control unit 1 turns on a charging voltage power source 25 with a charge signal SGC, thereby charging a developing device 27.

In the next step, a sheet remaining amount sensor 8 and a sheet size sensor 9 detects a sheet (not shown) and a size thereof, and the sheet is transported. A sheet supply motor (PM) 5 is capable of rotating in two directions through a driver 4. The sheet supply motor (PM) 5 rotates in a reverse direction to transport the sheet for a specific distance until a sheet inlet sensor 6 detects the sheet. Then, the sheet supply motor (PM) 5 rotates in a forward direction to transport the sheet into a printing mechanism in the electro-photography printer.

When the sheet reaches a printable position, the print control unit 1 sends a timing signal SG3 (including a main scanning synchronization signal and a sub scanning synchronization signal) to the upper controller, and the print control unit 1 receives the video signal SG2 from the upper controller. The upper controller edits the video signal SG2 per page. When the print control unit 1 receives the video signal SG2, the print control unit 1 sends the video signal SG2 as a print data signal HD-DATA to an LED (Light Emitting Diode) head 19. The LED head 19 is formed of a plurality of LEDs arranged therein each for printing one dot (pixel).

When the print control unit 1 receives the video signal SG2 for one line, the print control unit 1 sends a latch signal HD-LOAD to the LED head 19, so that the print data signal HD-DATA is stored in the LED head 19. Note that the print control unit 1 is capable of printing the print data signal HD-DATA stored in the LED head 19 while the print control unit 1 receives a next video signal SG2 from the upper controller. A clock signal HD-CLK is also sent to the LED head 19 for sending the print data signal HD-DATA.

In the embodiment, the video signal SG2 is sent and received per print line. Information to be printed with the LED head 19 is converted to a static latent image on a photosensitive drum (not shown) charged with a negative potential as a dot with an increased potential. In the developing device 27, toner charged with a negative potential is attracted to each dot through an electric attraction force, thereby forming a toner image.

In the next step, the toner image formed on the photosensitive drum is transported to a transfer device 28. A transfer voltage power source 26 becomes a negative potential with a transfer signal SG4, so that the transfer device 28 transfers the toner image to the sheet passing between the photosensitive drum and the transfer device 28.

After the toner image is transferred to the sheet, the sheet abuts against the fixing device 22 with the heater 22a disposed therein, and is transported further, thereby fixing the toner image to the sheet through heat of the fixing device 22. After the toner image is fixed to the sheet, the sheet is transported further, and is discharged from the printing mechanism of the printer to outside the printer after passing through a sheet discharge outlet sensor 7.

In the embodiment, the print control unit 1 applies a voltage from the transfer voltage power source 26 to the transfer device 28 only when the sheet passes through the transfer device 28 according to detections of the sheet size sensor 9 and the sheet inlet sensor 6. After the printing operation is performed and the sheet passes through the sheet discharge outlet sensor 7, the print control unit 1 stops the voltage from the charging voltage power source 25 to the developing device 27, and stops the developing-transfer process motor 3. Afterward, the operation described above is repeated.

Figure 2:
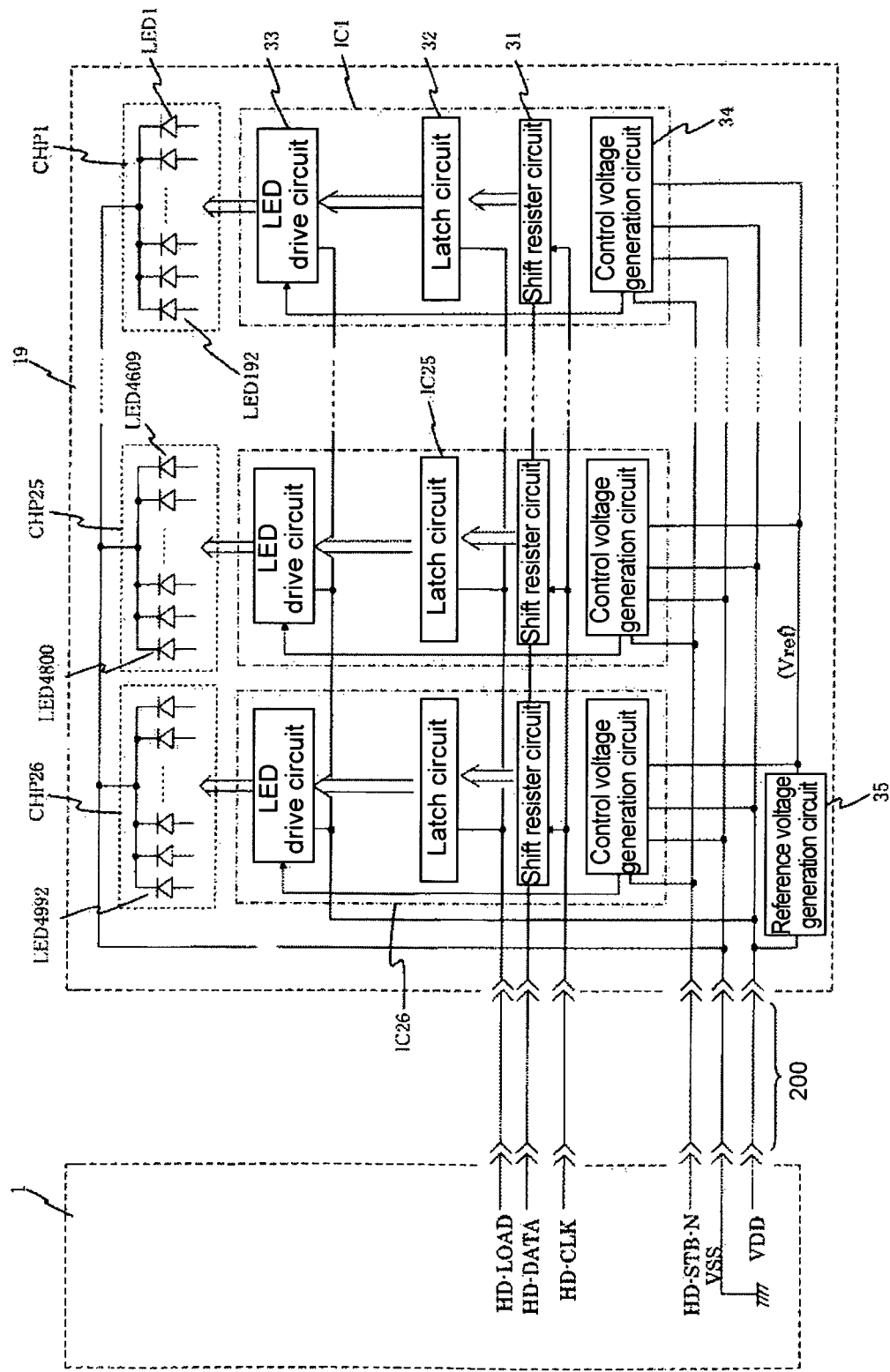
FIG. 2 is a block diagram showing a configuration of an LED (Light Emitting Diode) head and a print control unit according to the first embodiment of the present invention.

A configuration of the LED (Light Emitting Diode) head 19 will be explained next. FIG. 2 is a block diagram showing the configuration of the LED head 19 and the print control unit 1 according to the first embodiment of the present invention.

In the following description, as an example, the LED head 19 is capable of printing on a sheet with A-4 size at a resolution of 600 dots per one inch. In the embodiment, the LED head 19 includes a total of 4992 dots of the LED elements. More specifically, the LED head 19 includes 26 of LED arrays, and each LED array is formed of 192 of the LED elements.

As shown in FIG. 2, the print control unit 1 is connected to the LED head 19 through a connection cable 200. The connection cable 200 includes the print data signal HD-DATA; the clock signal HD-CLK; the latch signal HD-LOAD; the strobe signal HD-STB-N; a VSS cable as ground of control units of driver ICs IC1 to IC26; and a VDD cable as a power source of the LED head 19.

In the embodiment, the LED head 19 includes LED arrays CHP1 to CHP26, and LED arrays CHP3 to CHP25 are omitted in FIG. 2. The driver ICs IC1 to IC 26 are arranged to correspond to the LED arrays CHP1 to CHP26 for driving the LED arrays CHP1 to CHP26, respectively. The driver ICs IC1 to IC 26 are formed of an identical circuit, and adjacent driver ICs are connected in a cascade connection. The LED array CHP1 includes the LED elements LED1 to LED192, that is, each LED array includes 192 of the LED elements. Accordingly, the LED array CHP25 includes the LED elements LED4609 to LED4800, and the LED array CHP26 includes the LED elements LED4801 to LED4992.

In the LED head 19 shown in FIG. 2, 26 of the LED arrays (CHP1 to CHP26) and 26 of the driver ICs (IC1 to IC26) for driving the LED arrays are arranged on a print circuit board (not shown) to face each other. One chip of the driver IC is capable of driving 192 of the LED elements, and 26 chips of the driver ICs are connected in a cascade connection for transmitting in serial print data input from outside.

As described above, each of the driver ICs (IC1 to IC26) is formed of an identical circuit, and adjacent driver ICs are connected in a cascade connection.

In the embodiment, each of the driver ICs includes a shift resister circuit 31 for receiving the clock signal HD-CLK and performing shift transfer of print data; a latch circuit 32 for latching an output signal of the shift resister circuit 31 according to the latch signal (HD-LOAD); an LED drive circuit 33 for supplying a drive current from a power source VDD to the LED element (CHP1 etc.) according to an output signal of the latch circuit 32; and a control voltage generation circuit 34 for generating a control voltage, so that the drive current of the LED drive circuit 33 becomes constant. The strobe signal HD-STB-N is input to the control voltage generation circuit 34.

Further, a reference voltage generation circuit 35 is provided such that a power source thereof is connected to the power source VDD and a ground terminal thereof is connected to ground of the LED head 19. An output terminal of the reference voltage generation circuit 35 is connected to the control voltage generation circuit 34 of each of the driver ICS IC1 to IC26 for supplying a reference voltage Vref. Note that when the printing operation is performed, the print control unit 1 sends the print data signal HD-DATA, the clock signal HD-CLK, the latch signal HD-LOAD, and the strobe signal HD-STB-N.

Figure 3:
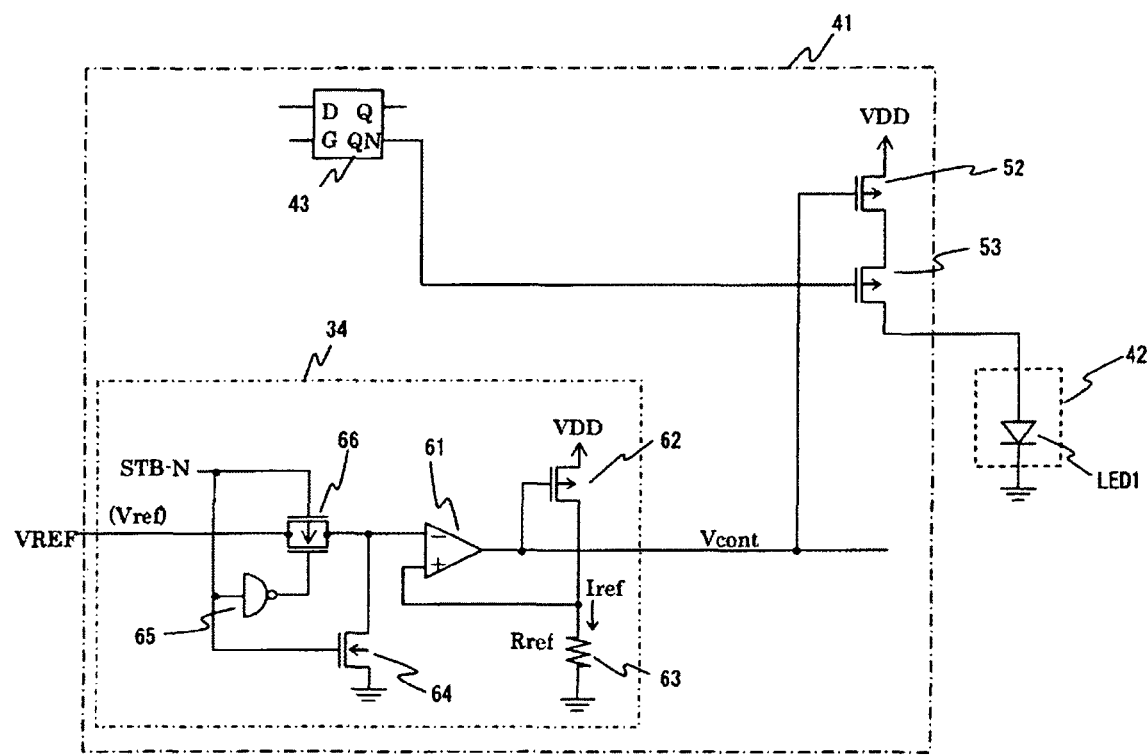
FIG. 3 is a circuit diagram showing a driver IC (Integrated Circuit) according to the first embodiment of the present invention.

FIG. 3 is a circuit diagram showing an LED drive main portion of the driver IC (Integrated Circuit) according to the first embodiment of the present invention. A connection relationship between the LED drive circuit 33 and a peripheral circuit thereof is shown in FIG. 3. In FIG. 3, the dot 1 (for example, a surrounding area of the drive circuit of the LED 1) is shown as an example.

As shown in FIG. 3, the driver IC 41 is indicated with a hidden line, the LED array 42 is indicated with a hidden line, and the control voltage generation circuit 36 is indicated with a projected line.

In the embodiment, the driver IC 41 includes a latch circuit 43 corresponding to one element of the latch circuits 32 shown in FIG. 2. Each of the driver ICs shown in FIG. 2 is provided with 192 of drive output terminals. Accordingly, the driver IC 41 includes 192 of the latch circuits 43 and PMOS transistors 52 and 53 (described later). On the other hand, one control voltage generation circuit 34 is provided in one driver IC.

In the embodiment, the driver IC 41 further includes the PMOS transistor 52 and the PMOS transistor 53. A source terminal of the PMOS transistor 52 is connected to the power source VDD, and a gate terminal thereof is connected to an output terminal of the control voltage generation circuit 34, i.e., an output terminal of an operational amplifier 61 (described later). A drain terminal of the PMOS transistor 53 is connected to a drive output terminal of the driver IC (not shown in FIG. 3), and further connected to an anode terminal of the LED element LED1 of the Led array 42. A cathode terminal of the LED element LED1 is connected to ground.

In the embodiment, an input terminal D of the latch circuit 43 is connected to an output terminal of the shift register (corresponding to the shift register 31 shown in FIG. 2), and an input terminal G thereof is connected to the latch signal HD-LOAD. An output terminal QN of the latch circuit 43 is connected to the gate terminal of the PMOS transistor 53.

In the control voltage generation circuit 34, the operational amplifier 61 outputs an output voltage Vcont. A resistor 63 has a resistivity of Rref. A P-channel MOS transistor 62 has a gate length the same as that of the PMOS transistor 52. A reference voltage Vref generated in the reference voltage generation circuit 35 is input to a reference voltage terminal VREF. A source terminal of the PMOS transistor 62 is connected to the power source VDD, a gate terminal thereof is connected to an output terminal of the operational amplifier 61, and a drain terminal thereof is connected to one end portion of the resistor 63 and a non-reverse input terminal of the operational amplifier 61.

In the embodiment, the control voltage generation circuit 34 further includes an analog switch circuit 66, in which first terminals and second terminals of a PMOS transistor and an NMOS transistor are connected in parallel with each other. The reference voltage terminal VREF is connected to the first terminal of the operational amplifier 61, and the second terminal of the operational amplifier 61 is connected to a reverse input terminal of the operational amplifier 61. In the control voltage generation circuit 34, a signal STB-N has logic the same as that of the strobe signal HD-STB-N of the LED head 19. The signal STB-N is connected to a gate terminal of the PMOS transistor of the analog switch circuit 66, an input terminal of an inverter circuit 65, and a gate terminal of an NMOS transistor 64.

In the embodiment, the output terminal of the inverter circuit 65 is connected to a gate terminal of the NMOS transistor of the analog switch circuit 66. The second terminal of the analog switch circuit 66 is connected to the reverse input terminal of the operational amplifier 61, and further connected to a drain terminal of the NMOS transistor 64. A source terminal of the NMOS transistor 64 is connected to ground.

When the signal STB-N is at a low level, the analog switch circuit 66 is turned on, and the NMOS transistor 64 is turned off. Accordingly, the reference voltage Vref applied to the reference voltage terminal VREF is supplied to the non-reverse input terminal of the operational amplifier 61. Note that the operational amplifier 61, the PMOS transistor 62, and the resistor 63 constitute a feedback control circuit. Accordingly, a current flowing through the resistor 63, that is, a current flowing through the PMOS transistor 62, is not depended on the power source voltage VDD, and is determined only by the reference voltage Vref and the resistivity Rref of the resistor 63.

In the embodiment, a gate potential of the PMOS transistors 52 and 62 is equal to the control voltage Vcont, and a source potential of the PMOS transistors 52 and 62 are the same. Accordingly, the PMOS transistors 52 and 62 have a same voltage between the gate terminals and the source terminals thereof, and have a current-mirror relationship. As a result, it is possible to adjust a drain current of the PMOS transistors 52 and 62 according to the reference voltage Vref, thereby making it possible to control a drive current of the LED element LED1 of the LED array 42 at a specific value.

In the embodiment, the PMOS transistor 53 is turned on to drive according to the print data latched with the latch circuit 43. At this moment, a drain current generated in the PMOS transistor 53 is dependent on the voltage between the gate terminals and the source terminals of the PMOS transistors 52 and 62. Accordingly, the PMOS transistor 53 functions as a switching element for switching the drain current.

Figure 4:
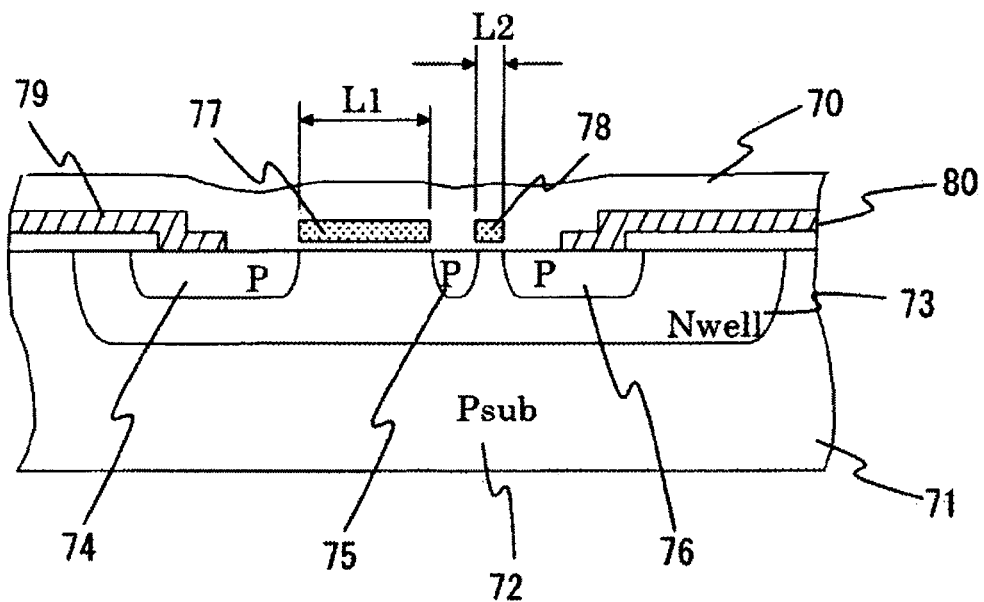
FIG. 4 is a schematic sectional view showing a PMOS transistor according to the first embodiment of the present invention.

FIG. 4 is a schematic sectional view showing the PMOS transistor 52 or 53 according to the first embodiment of the present invention. The sectional view is taken along a direction perpendicular to the source, gate, and drain wiring of the PMOS transistor 52 or 53.

As shown in FIG. 4, the PMOS transistor includes an IC chip 71 having a P-type region 72 as a sub-straight layer, an N-type well region formed in the sub-straight layer, and P-type regions 74 to 76 formed in the N-type well region 73. The PMOS transistor further includes a gate wiring portion 77 corresponding to the gate terminal of the PMOS transistor 52 shown in FIG. 3. The PMOS transistor also includes a gate wiring portion 78 corresponding to the gate terminal of the PMOS transistor 53. The wiring portions 77 and 78 have gate lengths L1 and L2, respectively.

As shown in FIG. 4, the PMOS transistor further includes a metal wiring portion 79 for connecting the P-type region (corresponding to the source terminal of the PMOS transistor 52) and the power source VDD (not shown in FIG. 4). The PMOS transistor further includes a metal wiring portion 80 for connecting the P-type region (corresponding to the drain terminal of the PMOS transistor 53) and the drive output terminal (not shown in FIG. 4). A protective film 70 covers an upper surface of the chip.

As shown in FIG. 4, the PMOS transistors 52 and 53 have the gate lengths L1 and L2, respectively, and the gate length L1 is larger than the gate length L2 (L1>L2). The PMOS transistor 52 has the gate length L1 the same as that of the PMOS transistor 62. The PMOS transistors 52 and 62 have the same source potential and the same gate potential, thereby constituting a current-mirror circuit. Accordingly, the drive current of the LED element LED1 is proportional to the reference current Iref, thereby obtaining the drive voltage according to the reference voltage Vref.

When the LED element is driven, it is not preferred that the drive current of the LED element varies according to a change in the forward direction voltage of the LED element. To this end, it is configured that the drive circuit has a large output impedance, and the PMOS transistor 52 has a large gate length for improving a constant current property thereof. The PMOS transistor 53 also functions as a switching element. The PMOS transistor 53 has the gate length corresponding to a minimum length allowable in a semiconductor manufacturing process, and it is preferred that the PMOS transistor 53 has a small area.

In the embodiment, the LED arrays are produced with a method disclosed, for example, Japanese Patent Publication No. 2007-081081. That is, an AlGaAs layer is epitaxially grown on a GaAs wafer substrate with a well-known MO-CVD (Metal Organic Chemical Vapor Deposition) method, thereby forming layer structures of P-type and N-type semiconductors. Afterward, the epitaxially layer is peeled off into a film shape with the method disclosed in the above reference. Then, the epitaxial layer is attached to an IC wafer with the drive circuit having the configuration shown in FIG. 3 integrated thereon with an epitaxial film bonding method, so that the terminals thereof are wired with a photolithography method. At last, the IC wafer is divided into a plurality of chips with a well-known dicing method, thereby forming an integrated chip formed of the light emitting element and the drive element.

Figure 5:
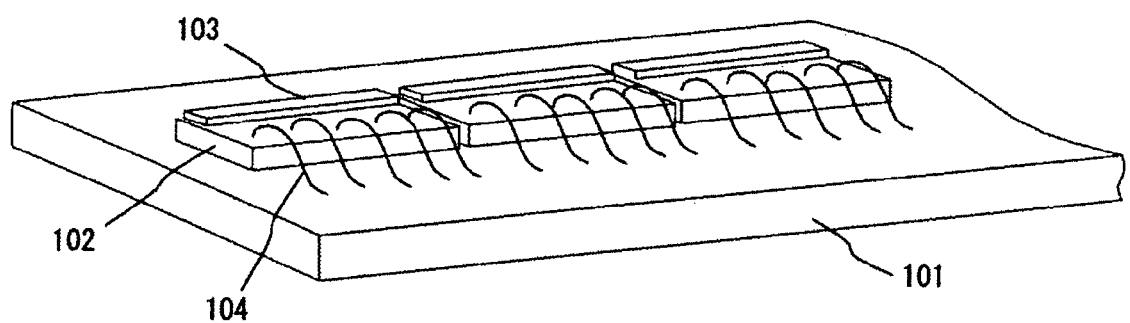
FIG. 5 is a schematic perspective view showing a circuit board unit of the LED head according to the first embodiment of the present invention.

FIG. 5 is a schematic perspective view showing a circuit board unit of the LED head 19 according to the first embodiment of the present invention. In the circuit board unit, the integrated chip formed of the light emitting element and the drive element is arranged on a print circuit board 101.

As shown in FIG. 5, IC chips 102 with the drive circuit integrated thereon are mounted on the print circuit board 101, and LED arrays 103 are arranged on the IC chips 102. The control signal terminals of the IC chips 102 are connected to wiring pads (not shown) on the print circuit board 101 with bonding wires 104.

Figure 6:
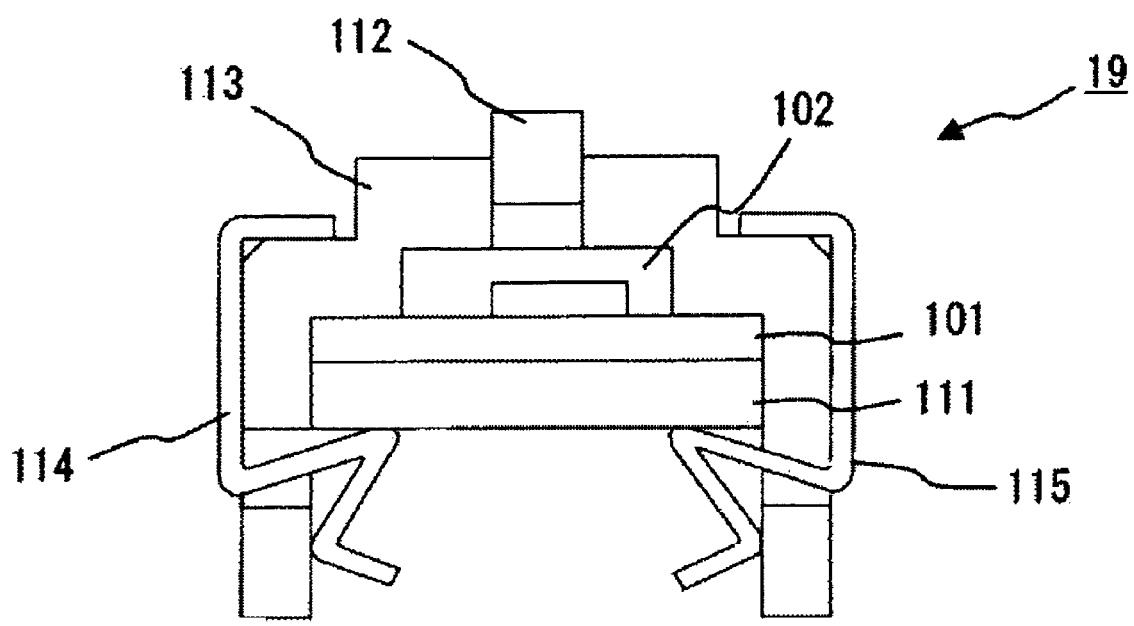
FIG. 6 is a schematic sectional view showing the LED head according to the first embodiment of the present invention.

FIG. 6 is a schematic sectional view showing the LED head 19 according to the first embodiment of the present invention. As shown in FIG. 6, the light print head 19 is formed of a base member 111; the print circuit board 101 fixed to the base member 111; a rod lens array 112 having a plurality of optical elements with a column shape arranged therein; a holder 113 for holding the rod lens array 112; and clamp members 114 and 115 for fixing the print circuit board 101, the base member 111, and the holder 113.

Figure 7:
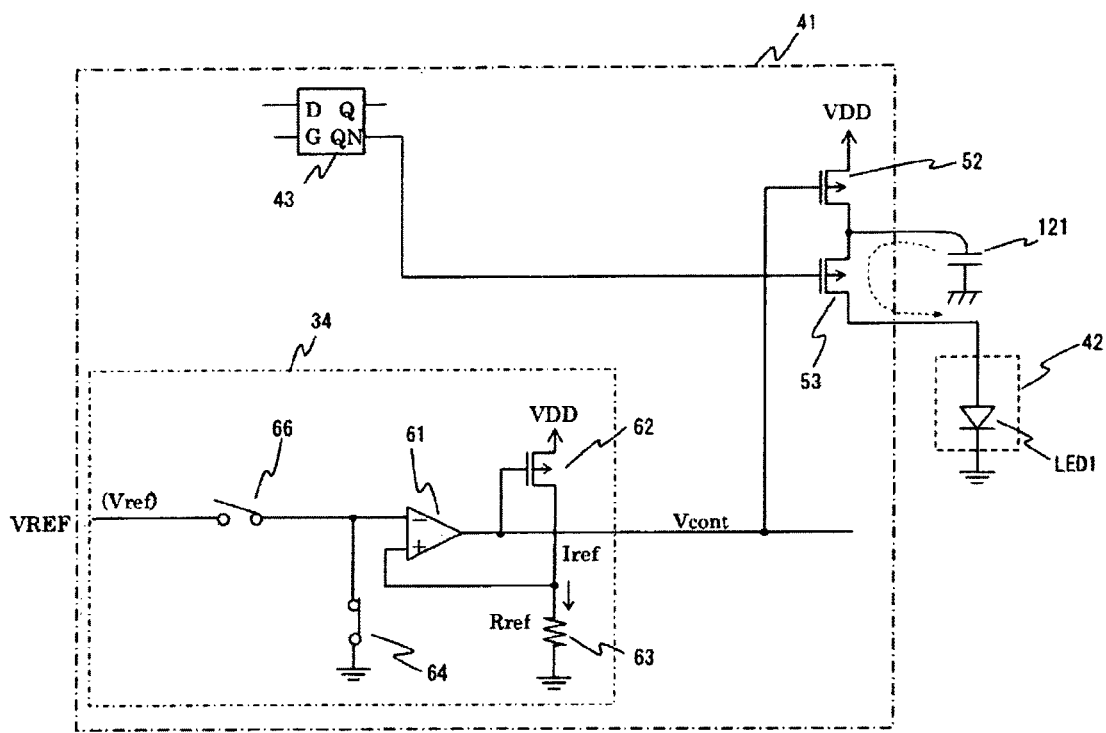
FIG. 7 is a circuit diagram showing an operation of a drive circuit according to the first embodiment of the present invention.

An operation of the drive circuit will be explained next. FIG. 7 is a circuit diagram showing the operation of the drive circuit according to the first embodiment of the present invention. The connection relationship between the LED drive circuit 33 and the peripheral circuit thereof is shown in FIG. 7. In FIG. 7, the dot 1 (for example, the surrounding area of the drive circuit of the LED 1) is shown as an example. FIG. 7 corresponds to FIG. 3, and the analog switch circuit 66 is replaced with a switch 66, and the PMOS transistor 64 is replaced with a switch 64 for simple presentation.

FIG. 7 shows an LED drive off state, and the strobe signal STB-N is at the high level. In this state, the switch 66 is turned off, and the switch 64 is turned on. Accordingly, the reference voltage Vref from outside is not supplied to the reverse input terminal of the operational amplifier 61. The non-reverse input terminal of the operational amplifier 61 is connected to ground through the switch 64, thereby having zero potential.

As described above, the reference current Iref is given by:

$$Iref = Vref/Rref$$

The reference voltage Vref corresponds to the potential of the reverse input terminal of the operational amplifier 61. Accordingly, when the reference voltage Vref becomes zero potential as shown in FIG. 7, the reference current Iref becomes zero. That is, the output potential Vcont of the operational amplifier 61 is equal to the power source VDD, and a difference between the output potential Vcont and the power source VDD is less than a threshold voltage of the PMOS transistor 62. Similarly, the PMOS transistor 52 with a similar threshold voltage is turned off.

As a result, a parasite capacitor 112 shown in FIG. 7 is not charged. When the LED drive starts and the PMOS transistor 53 is turned on in the initial stage, a discharge current of the parasite capacitor 112 does not flow into the LED element, thereby not causing an overshoot waveform.

Figure 8A:
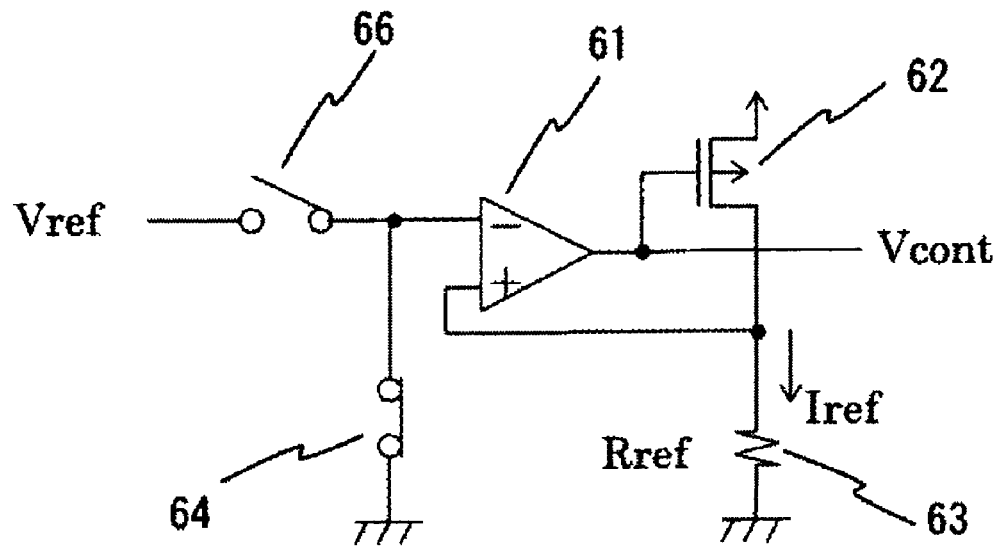
Figure 8B:
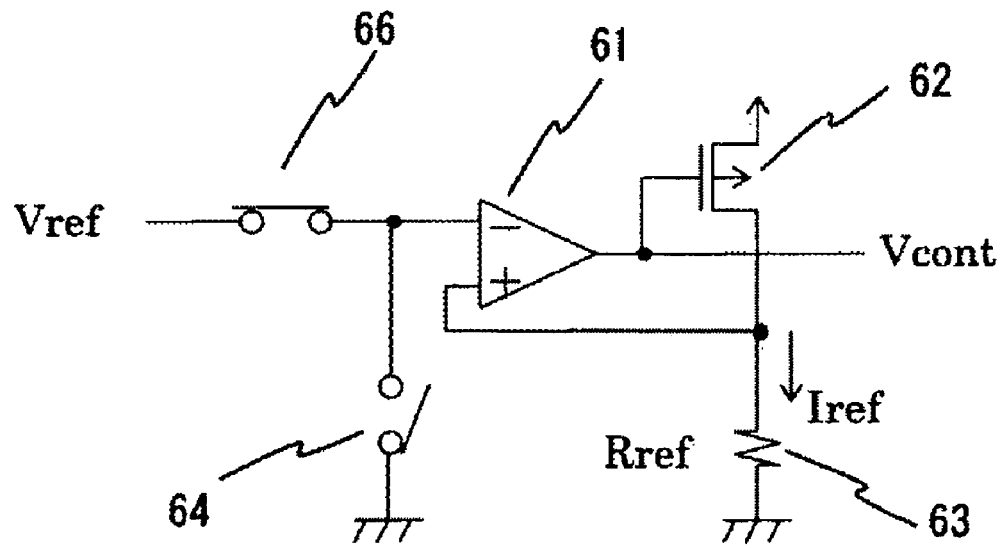

FIGS. 8(a) and 8(b) are circuit diagrams showing an operation of the control voltage generation circuit 34 according to the first embodiment of the present invention. More specifically, FIG. 8(a) is a circuit diagram showing an operation of the control voltage generation circuit 34 when the LED is driven, and FIG. 8(b) is a circuit diagram showing an operation of the control voltage generation circuit 34 when the LED is not driven.

As described above, in the LED drive off state, the strobe signal STB-N is at the high level. Accordingly, as shown in FIG. 8(a), the switch 66 is turned off and the switch 64 is turned on. Further, a voltage of zero is applied to the reverse input terminal of the operational amplifier 61, the PMOS transistor 62 is turned off, and the reference current Iref becomes substantially zero. As a result, the LED drive current proportional to the reference current Iref becomes substantially zero, thereby creating the non-drive state.

In the LED drive on state, the strobe signal STB-N is at the low level. Accordingly, as shown in FIG. 8(b), the switch 66 is turned on and the switch 64 is turned off. Further, the reference voltage Vref is applied to the reverse input terminal of the operational amplifier 61, the PMOS transistor 62 is turned on, and the reference current Iref becomes a specific level. As a result, the LED drive current proportional to the reference current Iref becomes a specific level, thereby creating the drive state.

Figure 9:
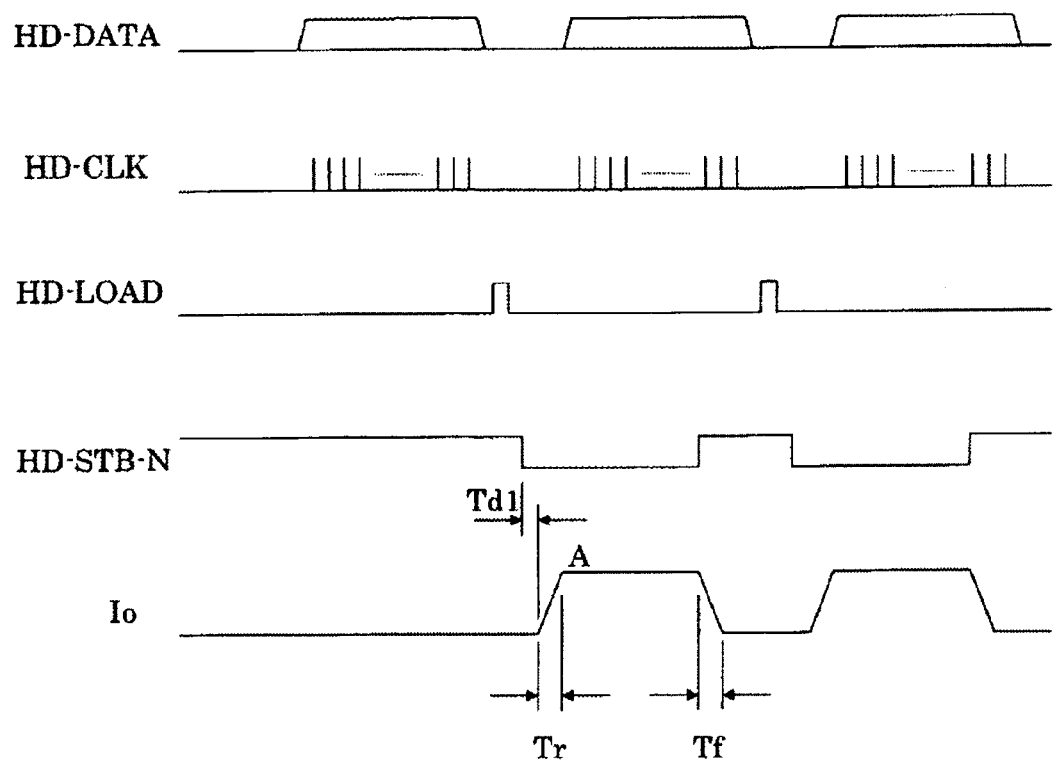
FIG. 9 is a time chart showing an operation of the drive circuit according to the first embodiment of the present invention.

FIG. 9 is a time chart showing an operation of the drive circuit according to the first embodiment of the present invention. When the print data is shift input to the shift register 31 shown in FIG. 2, and a HD-DATA signal pulse is input, the data temporarily stored in the shift register 31 are latch stored in the latch circuit 32. When the strobe signal HD-STB-N is input and rises, the LED drive current $I_O$ rises after a time Td1. When the strobe signal HD-STB-N rises for the LED drive off, the LED drive current $I_O$ falls.

Figure 20:
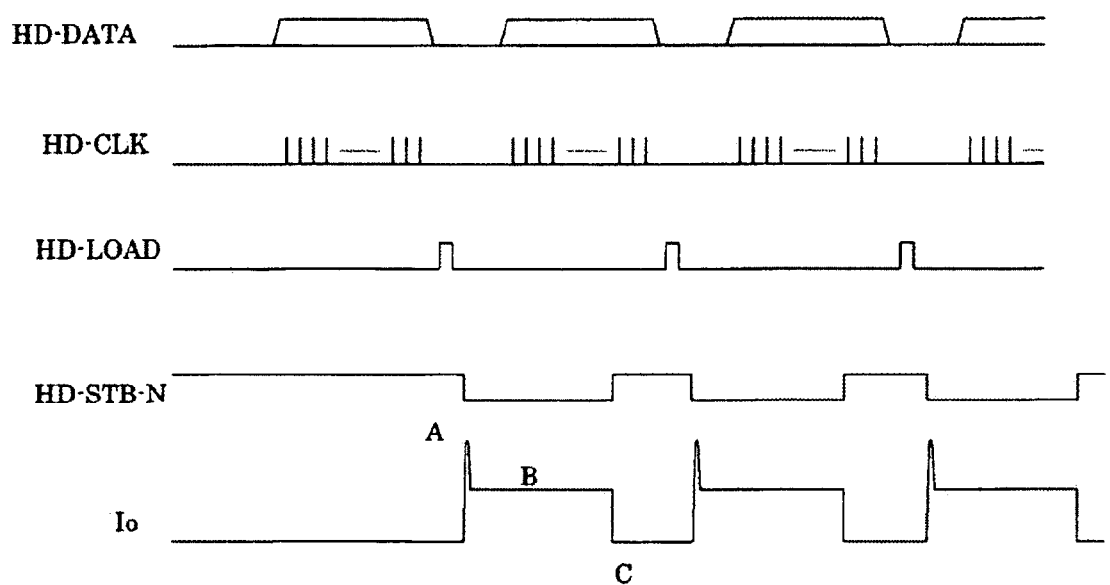
FIG. 20 is a time chart showing an operation of the conventional drive circuit.

As compared with the waveform in the conventional drive circuit shown in FIG. 20, in the embodiment as shown in FIG. 9, when the LED drive current $I_O$ rises, an overshoot at the point A in the waveform in the conventional drive circuit does not occur.

The rise time Tr and the fall time Tf of the LED drive current $I_O$ are shown in FIG. 9, and the rise time Tr and the fall time Tf are referred to as a transition time Tt. In a frequency response of the control voltage generation circuit 34 shown in FIG. 3, a frequency range width fc of the control voltage generation circuit 34 is determined by a frequency range of the operational amplifier 61 used in the control voltage generation circuit 34. From a theory of electrical circuits, the transition time Tt has the following well-known relationship:

$$Tt \approx 0.35/fc$$

Accordingly, when the frequency range of the operational amplifier 61 is set to 2 MHz as a general property (fc=2 MHz), the transition time Tt becomes 175 nS from the above equation. The conventional drive circuit has the LED drive current with the rise time of few tens nS. Accordingly, in the embodiment, the rise time becomes larger ten hold, thereby reducing the noise voltage generated with the switching of the LED current to one tenth.

As described above, in the drive circuit in the embodiment, it is possible to switch the LED drive current at a desirable transition time through adjusting the frequency range of the operational amplifier 61. Accordingly, it is possible to turn on and off the LED drive at a desirable switching speed while restricting the noise voltage accompanied with the switching.

As described above, in the embodiment, the drive circuit includes the first and second PMOS transistors 52 and 53 connected in series. The first PMOS transistor 52 functions as the constant voltage source for determining the drive current of the LED element. The second PMOS transistor 53 functions as the switch element for switching on and off of the LED element. The switching between on and off of the LED element is instructed to all of the output terminals of the driver ICs as the gate-source potential of the first PMOS transistor 52.

Further, in the embodiment, when the first PMOS transistor 52 is turned off, the second PMOS transistor 53 is switched between on and off. Accordingly, when the LED element is turned off, the parasite capacitor 112 connected to the drain terminal of the first PMOS transistor 52 as the equivalent circuit is not charged. As a result, when the LED element is turned on, the charges accumulated in the parasite capacitor 112 are not rapidly discharged through the second PMOS transistor 53 and the LED element, thereby preventing the overshoot of the drive current.

Further, in the embodiment, when the first PMOS transistor 52 is turned off, the second PMOS transistor 53 is switched between on and off. Accordingly, when the second PMOS transistor 53 is switched between on and off, the drive current does not change rapidly, thereby preventing malfunction of the drive circuit.

Second Embodiment

Figure 10:
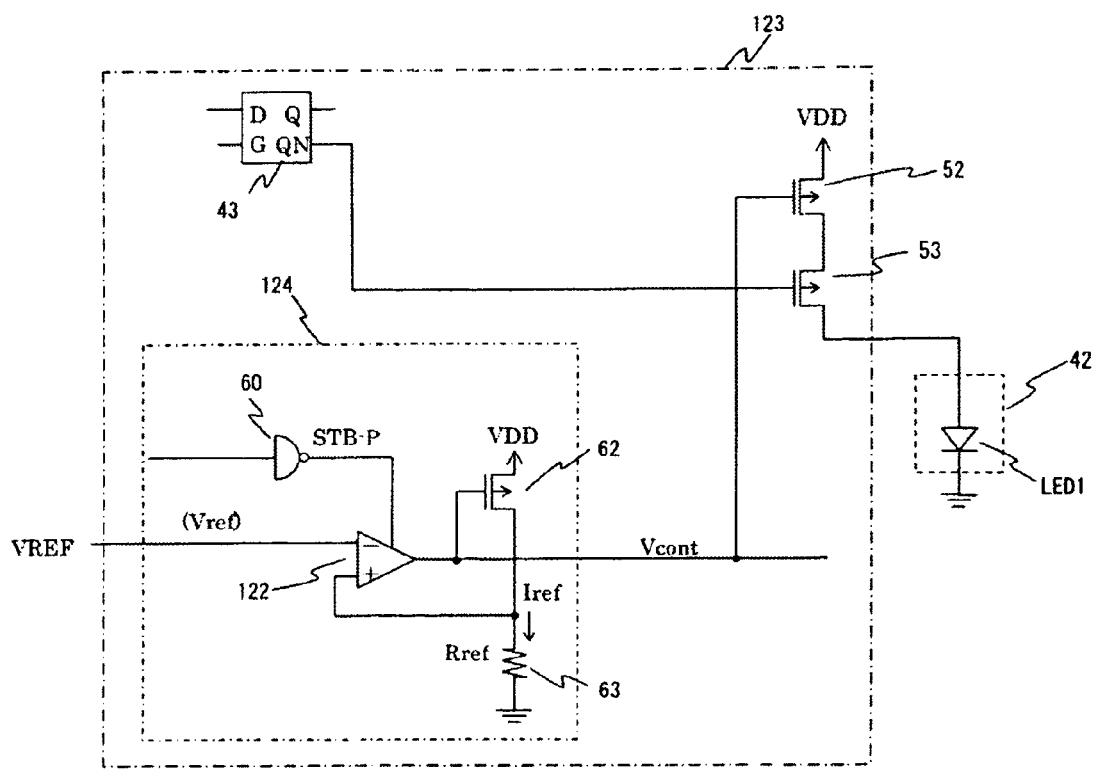
FIG. 10 is a circuit diagram showing a driver IC according to a second embodiment of the present invention.

A second embodiment of the present invention will be explained next. FIG. 10 is a circuit diagram showing an LED drive main portion of a driver IC 123 according to the second embodiment of the present invention. A connection relationship between the LED drive circuit and a peripheral circuit thereof is shown in FIG. 10. In FIG. 10, the dot 1 (for example, a surrounding area of the drive circuit of the LED 1) is shown as an example.

In the second embodiment, the driver IC 123 includes a control voltage generation circuit 124 having a configuration different from that of the control voltage generation circuit 34 shown in FIG. 3 in the first embodiment. Other similar elements are designated with the same reference numerals.

As shown in FIG. 10, the driver IC 123 includes the control voltage generation circuit 124. The control voltage generation circuit 124 includes an operational amplifier 122 having an output potential Vcon. The resistor 63 has the resistivity of Rref. The P-channel MOS transistor 62 has a gate length the same as that of the PMOS transistor 55. The reference voltage VREF generated in the reference voltage generation circuit 35 is input to a reverse input terminal of the operational amplifier 122. The inverter circuit 66 is connected to a control terminal C (described later) of the operational amplifier 122.

In the embodiment, the signal STB-N (not shown in FIG. 10) having logic the same as that of the strobe signal HD-STB-N of the LED head 19 is input to the input terminal of the inverter circuit 60. The inverter circuit 60 outputs an output signal STB-P. A source terminal of the PMOS transistor 62 is connected to the power source VDD, a gate terminal thereof is connected to an output terminal of the operational amplifier 122, and a drain terminal thereof is connected to one end portion of the resistor 63 and a non-reverse input terminal of the operational amplifier 122. The other end portion of the resistor 63 is connected to ground.

In the embodiment, the operational amplifier 122, the PMOS transistor 62, and the resistor 63 constitute a feedback control circuit. A current flowing through the resistor 63, that is, a current flowing through the PMOS transistor 62, is not depended on the power source voltage VDD, and is determined only by the reference voltage Vref and the resistivity Rref of the resistor 63.

In the embodiment, the gate potential of the PMOS transistors 52 and 62 are equal to the control voltage Vcont, and the source potential thereof is the same. Accordingly, the PMOS transistors 52 and 62 have the same voltage between the gate terminals and the source terminals thereof, and have a current-mirror relationship. As a result, it is possible to adjust a drain current of the PMOS transistors 52 and 62 according to the reference voltage Vref, thereby making it possible to control a drive current of the LED element LED1 of the LED array 42 at a specific value.

In the embodiment, the PMOS transistor 53 is turned on to drive according to the print data latched with the latch circuit 43. At this moment, the drain current generated in the PMOS transistor 53 is dependent on the voltage between the gate terminals and the source terminals of the PMOS transistors 52 and 62. Accordingly, the PMOS transistor 53 functions as a switching element for switching the drain current.

Figure 11A:
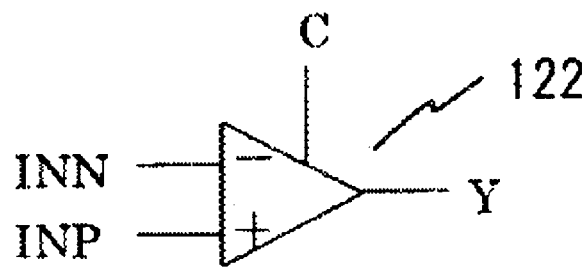
Figure 11B:
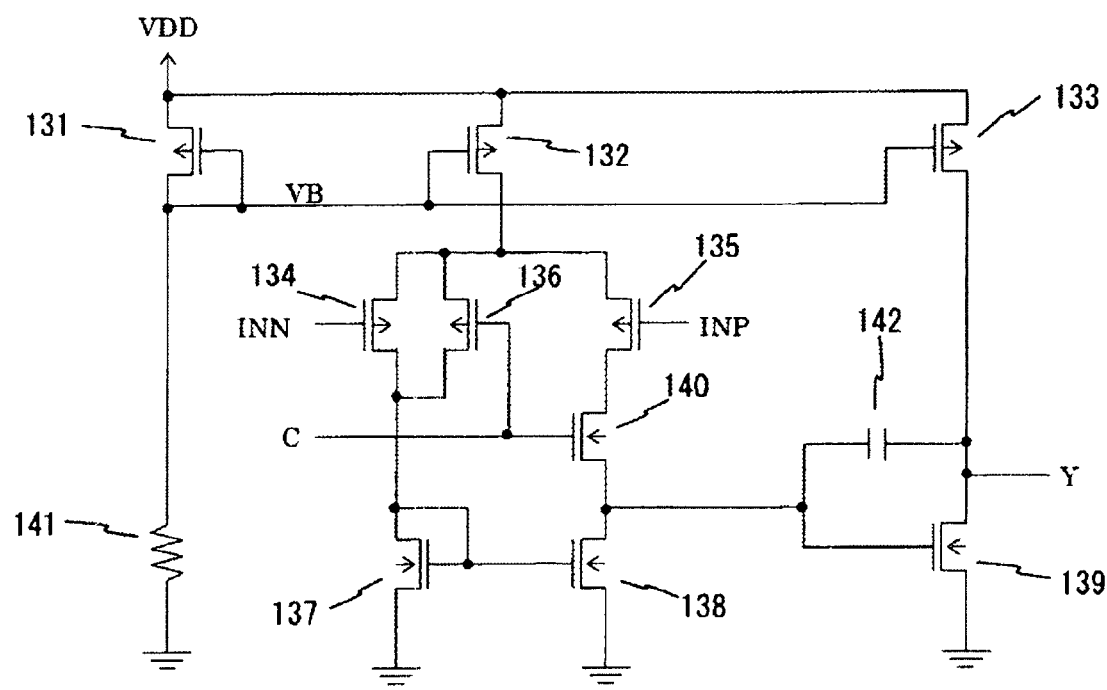

FIGS. 11(a) and 11(b) are circuit diagrams showing the operational amplifier 122 shown in FIG. 10 according to the second embodiment of the present invention. More specifically, FIG. 11(a) is a circuit diagram showing a circuit symbol of the operational amplifier 122, and FIG. 11(b) is a circuit diagram showing a configuration of the operational amplifier 122. As shown in FIG. 11(a), the operational amplifier 122 has a reverse input terminal INN, a non-reverse input terminal INP, a control input terminal C, and an output terminal Y.

As shown in FIG. 11(b), the operational amplifier 122 includes PMOS transistors 131 to 136; NMOS transistor 137 to 140; a resistor 141; and a capacitor 142. Source terminals of the PMOS transistors 131 to 136 are connected to the power source VDD. Gate terminals of the PMOS transistors 131 to 133 are connected to each other and the gate terminal of the PMOS transistor 131, and further connected to ground through the resistor 141. The PMOS transistors 131 to 133 have a gate potential VB.

In the embodiment, a drain terminal of the PMOS transistor 132 is connected to source terminals of the PMOS transistors 134 to 136. Drain terminals of the PMOS transistors 134 and 136 are connected to a gate terminal and a drain terminal of the NMOS transistor 137. A drain terminal of the PMOS transistor 135 is connected to a drain terminal of the NMOS transistor 140. A source terminal of the NMOS transistor 140 is connected to a drain terminal of the PMOS transistor 138.

In the embodiment, a drain terminal of the PMOS transistor 133 is connected to a drain terminal of the NMOS transistor 139 and the output terminal Y. Source terminals of the NMOS transistors 137 to 139 are connected to ground. A drain terminal of the NMOS transistor 138 is connected to a gate terminal of the NMOS transistor 139 and one end portion of the capacitor 142. The other end portion of the capacitor 142 is connected to a drain terminal of the NMOS transistor 139. The non-reverse input terminal INP is connected to the gate terminal of the PMOS transistor 135, and the reverse input terminal INN is connected to the gate terminal of the PMOS transistor 134. The control input terminal C is connected to the gate terminal of the PMOS transistor 136 and the gate terminal of the NMOS transistor 140.

Figure 12A:
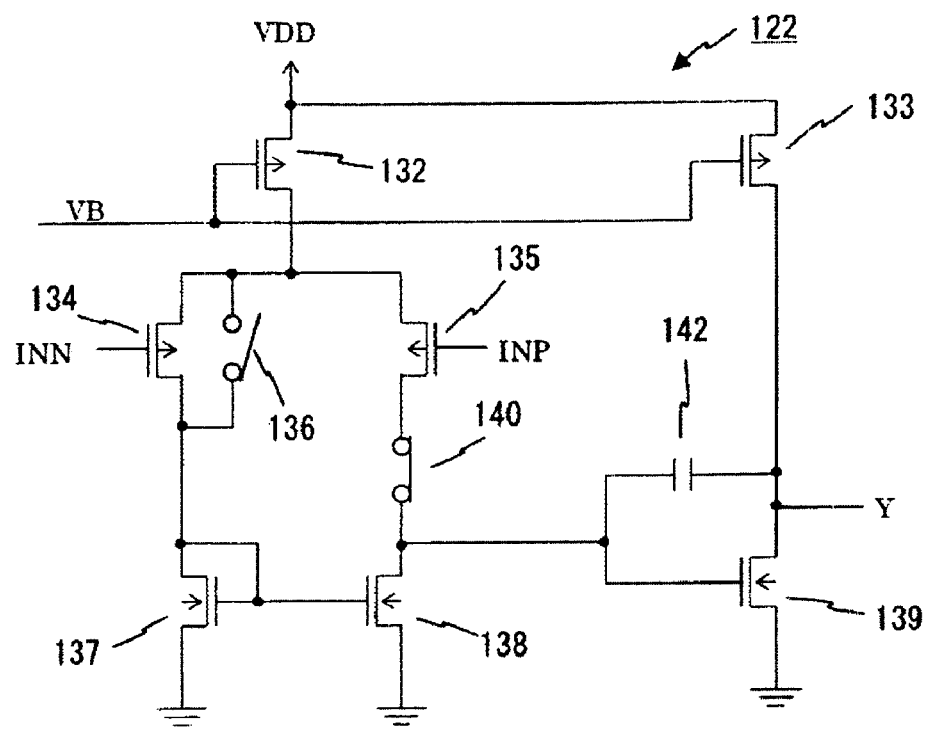
Figure 12B:
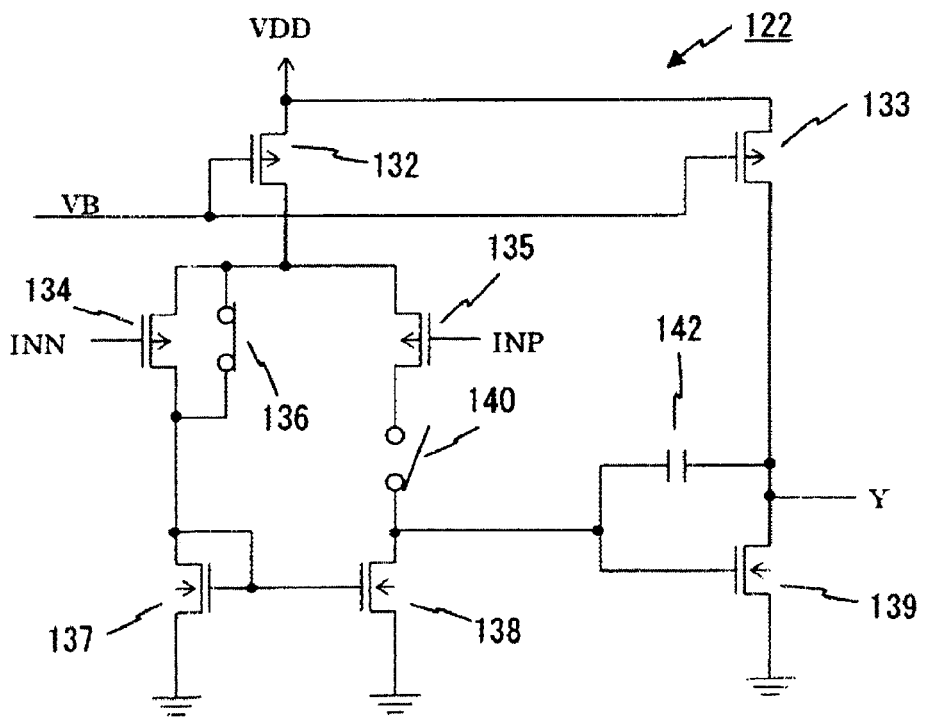

An operation of the operational amplifier 122 will be explained next. FIGS. 12(*a*) and 12(*b*) are circuit diagrams showing an operation of the operational amplifier 12 according to the second embodiment of the present invention. FIGS. 12(*a*) and 12(*b*) show the operation of the operational amplifier 122 when a signal applied to the control terminal C is at a high level and a low level. In FIGS. 12(*a*) and 12(*b*), the PMOS transistor 136 and the NMOS transistor 140 shown in FIG. 11(*b*) are represented as switches 136 and 140 for showing an on state and an off state thereof. Note that the PMOS transistor 131 and the resistor 141 are omitted in FIGS. 12(*a*) and 12(*b*).

FIG. 12(*a*) is a circuit diagram showing the operation of the operational amplifier 122 when the signal at the high level is applied to the control terminal C. At this time, the strobe signal STB-P is at a high level, and the LED element is in the drive on state. FIG. 12(*b*) is a circuit diagram showing an operation of the operational amplifier when the LED is not driven when the signal at the low level is applied to the control terminal C. At this time, the strobe signal STB-P is at a low level, and the LED element is in the drive off state.

In the LED drive on state, as shown in FIG. 12(*a*), the switch 136 is turned off and the switch 140 is turned on. Accordingly, the operational amplifier 122 becomes a well-known operational amplifier, and performs the operation the same as that of the conventional configuration. In the LED drive off state, on the other hand, as shown in FIG. 12(*b*), the switch 136 is turned on and the switch 140 is turned off. Accordingly, the source terminal and the drain terminal of the PMOS transistor 134 are shorted. As a result, a drain current of the PMOS transistor 132 is equal to a drain current of the NMOS transistor 137 regardless of a potential of the gate terminal (the reference voltage Vref is applied to the gate terminal) of the PMOS transistor 132.

When the NMOS transistor 137 is turned on, the NMOS transistor 138 having the same potential as that of the NMOS transistor 137 is also turned on, so that a drain potential thereof becomes substantially zero. The drain potential is applied to the gate terminal of the NMOS transistor 139, so that the NMOS transistor 139 is turned off. Further, the switch 140 is turned off, so that the operational state of the PMOS transistor 135 is not transferred to the NMOS transistor 138.

As described above, the same gate-source voltage is applied to the PMOS transistors 132 and 133, so that the PMOS transistor 133 is turned on. Accordingly, a potential Vcont substantially the same as the power source potential VDD is output from the output terminal Y of the operational amplifier 122. When the potential Vcont becomes equal to the power source potential VDD, the PMOS transistor 52 shown in FIG. 10 is turned off, thereby not driving the LED element LED1.

Figure 13:
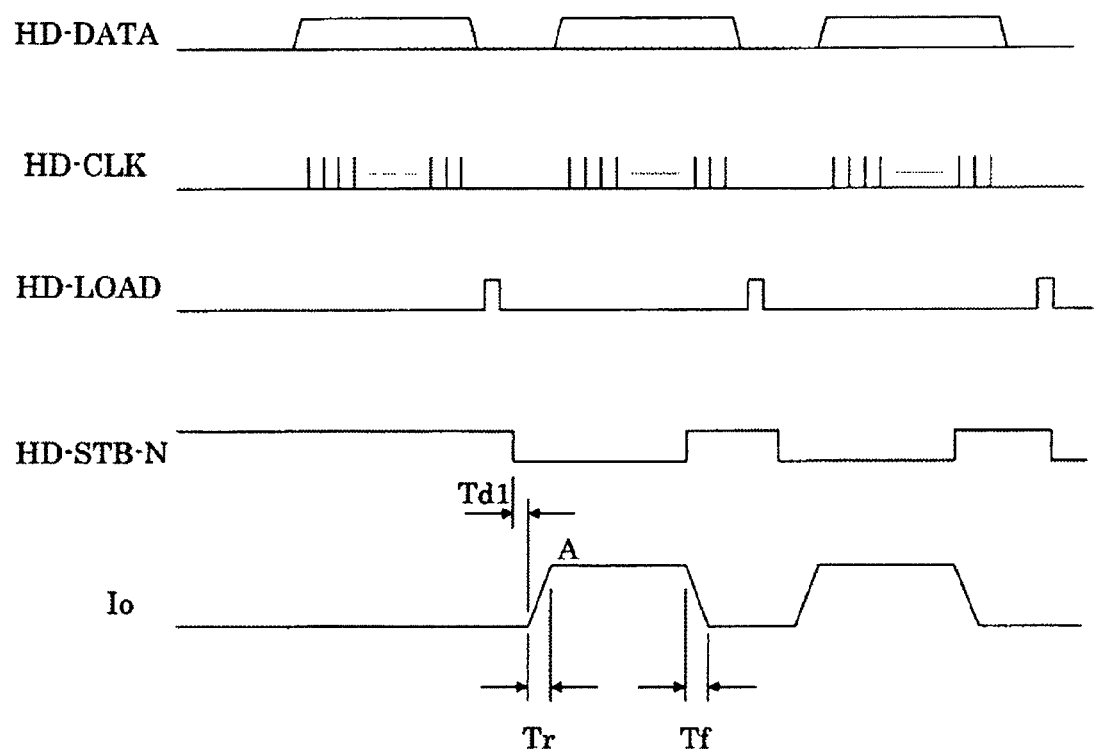
FIG. 13 is a time chart showing an operation of a drive circuit according to the second embodiment of the present invention.

FIG. 13 is a time chart showing the operation of the drive circuit according to the second embodiment of the present invention. As shown in FIG. 13, when the print data is shift input to the shift register 31 shown in FIG. 2, and the HD-DATA signal pulse is input, the data temporarily stored in the shift register 31 are latch stored in the latch circuit 32. When the strobe signal HD-STB-N is input and rises, the LED drive current $I_0$ rises after the time Td1. When the strobe signal HD-STB-N rises for the LED drive off, the LED drive current $I_0$ falls.

The rise time Tr and the fall time Tf of the LED drive current $I_0$ are shown in FIG. 13. As compared with the waveform in the conventional drive circuit shown in FIG. 20, in the embodiment as shown in FIG. 13, when the LED drive current $I_0$ rises, an overshoot at the point A in the waveform in the conventional drive circuit does not occur.

In the embodiment, the rise time Tr and the fall time Tf are referred to as the transition time Tt. In a frequency response of the control voltage generation circuit 124 shown in FIG. 10, a frequency range width fc of the control voltage generation circuit 124 is determined by a frequency range of the operational amplifier 122 used in the control voltage generation circuit 124. From a theory of electrical circuits, the transition time Tt has the following well-known relationship:

$$Tt \approx 0.35/fc$$

Accordingly, when the frequency range of the operational amplifier 122 is set to 2 MHz as a general property (fc=2 MHz), the transition time Tt becomes 175 nS from the above equation. The conventional drive circuit has the LED drive current with the rise time of few tens nS. Accordingly, in the embodiment, the rise time becomes larger ten hold, thereby reducing the noise voltage generated with the switching of the LED current to one tenth.

As described-above, in the drive circuit in the embodiment, it is possible to switch the LED drive current at a desirable transition time through adjusting the frequency range of the operational amplifier 122. Accordingly, it is possible to turn on and off the LED drive at a desirable switching speed while restricting the noise voltage accompanied with the switching.

As described above, in the embodiment, the operational amplifier 122 has the different configuration. When the LED element is not driven, the output potential of the operational amplifier 122 output to the gate terminal of the PMOS transistor 52 becomes equal to the power source potential VDD. Accordingly, when the LED element is turned off, the parasite capacitor connected to the drain terminal of the PMOS transistor 52 as the equivalent circuit is not charged. As a result, when the LED element is turned on, the charges accumulated in the parasite capacitor are not rapidly discharged through the PMOS transistor 53 and the LED element, thereby preventing the overshoot of the drive current.

Further, in the embodiment, when the PMOS transistor 52 is turned off, the first PMOS transistor 53 is switched between on and off. Accordingly, when the PMOS transistor 53 is switched between on and off, the drive current does not change rapidly, thereby preventing malfunction of the drive circuit due to the noise voltage.

Third Embodiment

Figure 14:
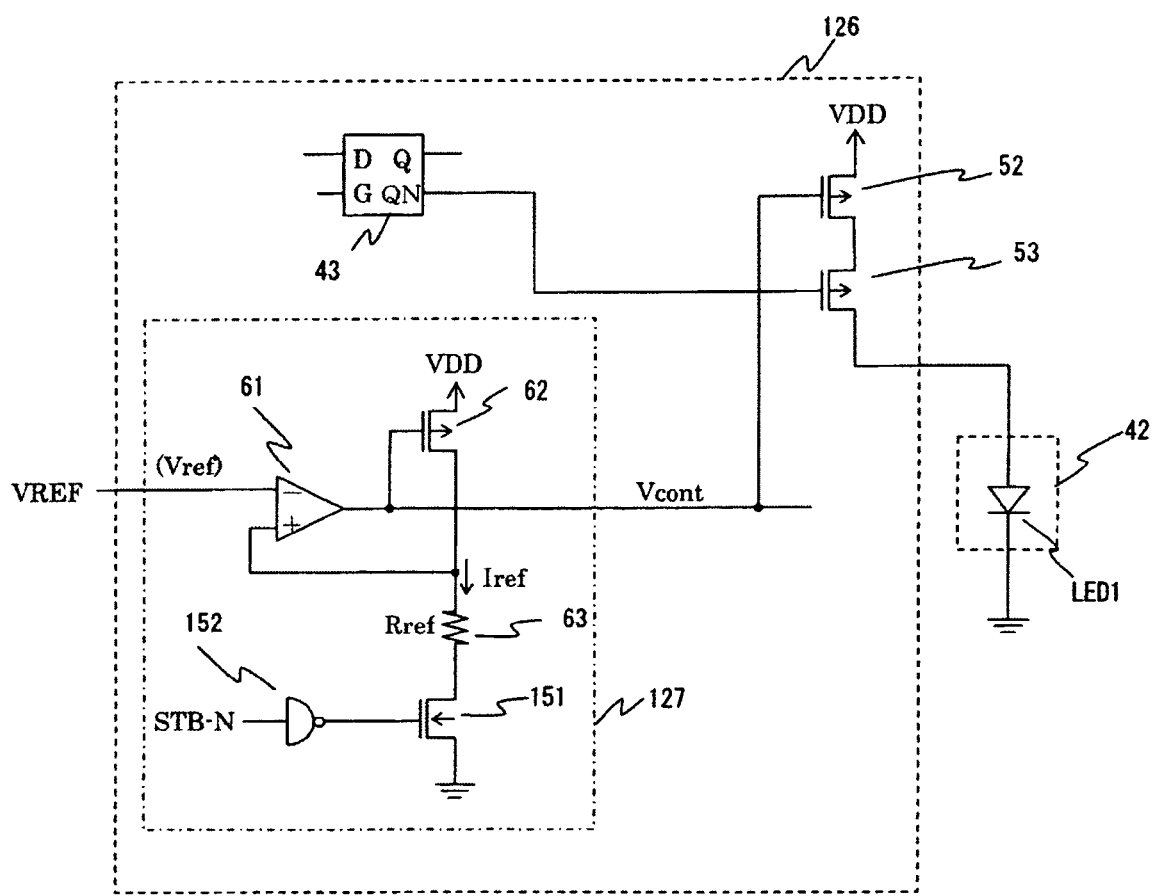
FIG. 14 is a circuit diagram showing a driver IC according to a third embodiment of the present invention.

A third embodiment of the present invention will be explained next. FIG. 14 is a circuit diagram showing an LED drive main portion of a driver IC 126 according to the third embodiment of the present invention. A connection relationship between the LED drive circuit and a peripheral circuit thereof is shown in FIG. 14. In FIG. 14, the dot 1 (for example, a surrounding area of the drive circuit of the LED 1) is shown as an example.

In the third embodiment, the driver IC 126 includes a control voltage generation circuit 127 having a configuration different from that of the control voltage generation circuit 34 shown in FIG. 3 in the first embodiment. Other similar elements are designated with the same reference numerals.

As shown in FIG. 14, the driver IC 126 includes the control voltage generation circuit 127. The control voltage generation circuit 127 includes the operational amplifier 61 having the output potential Vcon. The resistor 63 has the resistivity of Rref. The PMOS transistor 62 has a gate length the same as that of the PMOS transistor 55. The reference voltage VREF generated in the reference voltage generation circuit 35 is input to the reverse input terminal of the operational amplifier 61. The driver IC 126 further includes an inverter circuit 152.

In the embodiment, the signal STB-N (not shown in FIG. 14) having logic the same as that of the strobe signal HD-STB-N of the LED head 19 is input to the input terminal of the inverter circuit 152. The inverter circuit 152 outputs an output signal to a gate terminal of an NMOS transistor 151. The source terminal of the PMOS transistor 62 is connected to the power source VDD, the gate terminal thereof is connected to the output terminal of the operational amplifier 61, and the drain terminal thereof is connected to one end portion of the resistor 63 and the non-reverse input terminal of the operational amplifier 61. The other end portion of the resistor 63 is connected to a drain terminal of the NMOS transistor 151. A source terminal of the NMOS transistor 151 is connected to ground.

In the embodiment, the operational amplifier 61, the PMOS transistor 62, and the resistor 63 constitute the feedback control circuit. A current flowing through the resistor 63 is not depended on the power source voltage VDD, and is determined only by the reference voltage Vref and the resistivity Rref of the resistor 63. The gate potential of the PMOS transistors 52 and 62 is equal to the control voltage Vcont, and the source potential thereof is the same. Accordingly, the PMOS transistors 52 and 62 have the same voltage between the gate terminals and the source terminals thereof, and have a current-mirror relationship.

As a result, it is possible to adjust a drain current of the PMOS transistors 52 and 62 according to the reference voltage Vref, thereby making it possible to control a drive current of the LED element LED1 of the LED array 42 at a specific value. Further, the PMOS transistor 53 is turned on to drive according to the print data latched with the latch circuit 43. At this moment, the drain current generated in the PMOS transistor 53 is dependent on the voltage between the gate terminals and the source terminals of the PMOS transistors 52 and 62. Accordingly, the PMOS transistor 53 functions as a switching element for switching the drain current.

An operation of the driver IC 126 will be explained next. As shown in FIG. 14, the strobe signal STB-N is input to the input terminal of the inverter 152. When the LED element is instructed to emit light, the strobe signal STB-N becomes the low level. When the strobe signal STB-N is input, the inverter 152 logically reverses the strobe signal STB-N to be at the high level, and the output signal is input to the gate terminal of the NMOS transistor 151, so that the connection between the drain terminal and the source terminal thereof is turned on.

In the embodiment, the resistivity of the NMOS transistor 151 in the on state is set to a value negligibly small relative to the resistivity Rref of the resistor 63. Accordingly, similar to the first embodiment, the reference current Iref is given by:

$Iref=Vref/Rref$

Accordingly, it is possible to obtain the reference current Iref with a desirable value through properly adjusting the reference voltage Vref and the reference resistivity Rref. Further, it is possible to obtain a desirable value of the drain current of the PMOS transistor 52 having the proportional relationship with the reference current Iref.

When the LED element is instructed to stop emitting light, the strobe signal STB-N becomes the high level. When the strobe signal STB-N is input, the inverter 152 logically reverses the strobe signal STB-N to be at the low level, and the output signal is input to the gate terminal of the NMOS transistor 151, so that the connection between the drain terminal, and the source terminal thereof is turned off. The resistivity of the NMOS transistor 151 in the off state is set to a value significantly large relative to the resistivity Rref of the resistor 63, corresponding to an infinite value. Accordingly, from the equation Iref=Vref/Rref, the reference current Iref becomes infinite. As a result, the reference current Iref becomes substantially zero, and the drain current of the PMOS transistor 52 having the proportional relationship with the reference current Iref becomes substantially zero.

In the embodiment, the operation shown in FIG. 14 is performed according to a time chart similar to that shown in FIG. 13. As shown in FIG. 13, when the signal HD-DATA and the signal HD-CLK are input, the print data is shift input to the shift register 31 shown in FIG. 2, and the HD-DATA signal pulse is input, the data temporarily stored in the shift register 31 are latch stored in the latch circuit 32. When the strobe signal HD-STB-N is input and rises, the LED drive current $I_O$ rises after the time Td1. When the strobe signal HD-STB-N rises for the LED drive off, the LED drive current $I_O$ falls.

As compared with the waveform in the conventional drive circuit shown in FIG. 20, in the embodiment as shown in FIG. 13, when the LED drive current $I_O$ rises, an overshoot at the point A in the waveform in the conventional drive circuit does not occur. The rise time Tr and the fall time Tf of the LED drive current $I_O$ are shown in FIG. 13. The rise time Tr and the fall time Tf are referred to as the transition time Tt.

In a frequency response of the control voltage generation circuit 127 shown in FIG. 14, a frequency range width fc of the control voltage generation circuit 127 is mainly determined by a frequency range of the operational amplifier 61 used in the control voltage generation circuit 127. From a theory of electrical circuits, the transition time Tt has the following well-known relationship:

$Tt \approx 0.35/fc$

Accordingly, when the frequency range of the operational amplifier 61 is set to 2 MHz as a general property (fc=2 MHz), the transition time Tt becomes 175 nS from the above equation. The conventional drive circuit has the LED drive current with the rise time of few tens nS. Accordingly, in the embodiment, the rise time becomes larger ten hold, thereby reducing the noise voltage generated with the switching of the LED current to one tenth.

As described above, in the drive circuit in the embodiment, it is possible to switch the LED drive current at a desirable transition time through adjusting the frequency range of the operational amplifier 61. Accordingly, it is possible to turn on and off the LED drive at a desirable switching speed while restricting the noise voltage accompanied with the switching.

As described above, in the embodiment, the PMOS transistors 52 and 62 are configured to have the current-mirror relationship, and the NMOS transistor 151 is connected to the drain terminal of the PMOS transistor 62. Further, it is configured that the strobe signal STB-N is input to the NMOS transistor 151 through the inverter 152. When the LED element is not driven, the drain current of the PMOS transistor 62 becomes substantially zero, and the drain current of the PMOS transistor 52 having the proportional relationship with the PMOS transistor 62 also becomes substantially zero.

Accordingly, when the LED element is turned off, the parasite capacitor connected to the drain terminal of the PMOS transistor 52 as the equivalent circuit is not charged. As a result, when the LED element is turned on, the charges accumulated in the parasite capacitor are not rapidly discharged through the PMOS transistor 53 and the LED element, thereby preventing the overshoot of the drive current.

Further, the PMOS transistor 53 is switched between on and off when the PMOS transistor 52 is turned off. Accordingly, when the PMOS transistor 53 is switched between on and off, the drive current does not change rapidly, thereby preventing a noise voltage and malfunction of the drive circuit.

Fourth Embodiment

Figure 15:
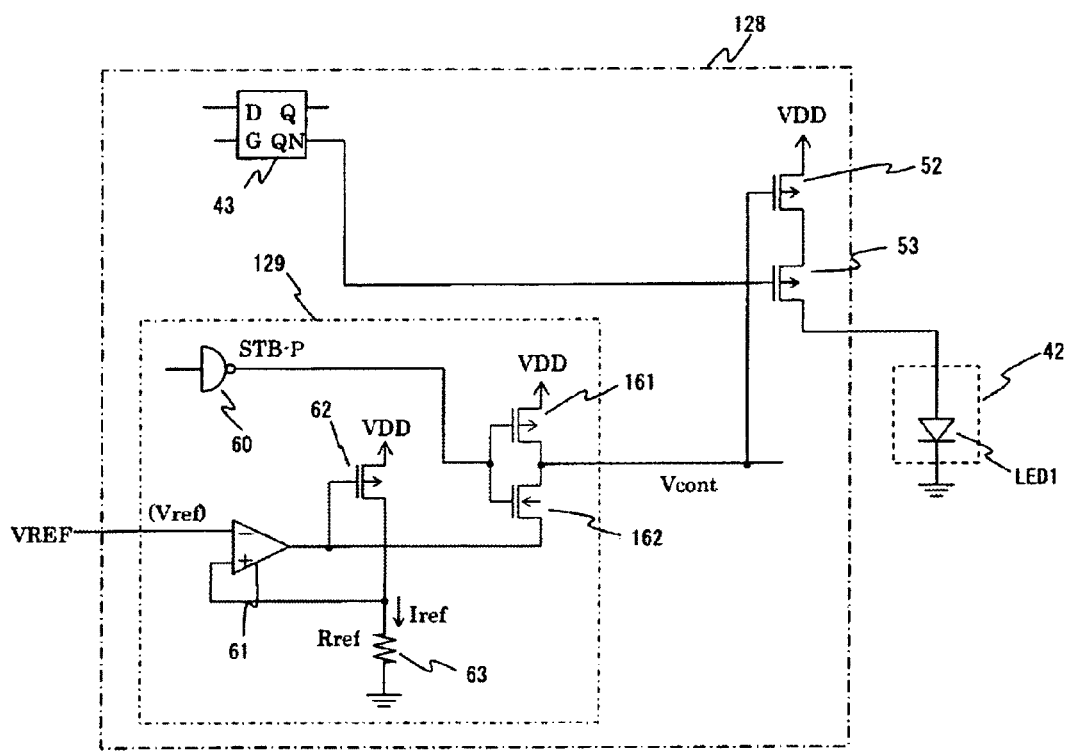
FIG. 15 is a circuit diagram showing a driver IC according to a fourth embodiment of the present invention.

A fourth embodiment of the present invention will be explained next. FIG. 15 is a circuit diagram showing an LED drive main portion of a driver IC 128 according to the fourth embodiment of the present invention. A connection relationship between the LED drive circuit and a peripheral circuit thereof is shown in FIG. 15. In FIG. 15, the dot 1 (for example, a surrounding area of the drive circuit of the LED 1) is shown as an example.

In the fourth embodiment, the driver IC 128 includes a control voltage generation circuit 129 having a configuration different from that of the control voltage generation circuit 34 shown in FIG. 3 in the first embodiment. Other similar elements are designated with the same reference numerals.

As shown in FIG. 15, the driver IC 128 includes the control voltage generation circuit 129. The control voltage generation circuit 129 includes the operational amplifier 61 having the output potential Vcon. The resistor 63 has the resistivity of Rref. The PMOS transistor 62 has a gate length the same as that of the PMOS transistor 55. The reference voltage VREF generated in the reference voltage generation circuit 35 is input to the reverse input terminal of the operational amplifier 61. The driver IC 128 further includes the inverter circuit 60.

In the embodiment, the signal STB-N (not shown in FIG. 15) having logic the same as that of the strobe signal HD-STB-N of the LED head 19 is input to the input terminal of the inverter circuit 60. The inverter circuit 60 outputs the output signal STB-P. The source terminal of the PMOS transistor 62 is connected to the power source VDD, the gate terminal thereof is connected to the output terminal of the operational amplifier 61, and the drain terminal thereof is connected to one end portion of the resistor 63 and the non-reverse input terminal of the operational amplifier 61. The other end portion of the resistor 63 is connected to ground.

In the embodiment, a source terminal of a PMOS transistor 161 is connected to ground, and a drain terminal thereof is connected to a drain terminal of the NMOS transistor 162, and further connected to the gate terminal of the PMOS transistor 52 as the control potential Vcon. A source terminal of the NMOS transistor 162 is connected to the output terminal of the operational amplifier 61. A gate terminal of the PMOS transistor 161 is connected to a gate terminal of the NMOS transistor 162, and further connected to the output terminal of the inverter circuit 60.

When the LED element is instructed to emit light, the strobe signal STB-N becomes the high level. At this moment, the PMOS transistor 161 is turned off, and the NMOS transistor 162 is turned on. Accordingly, the control potential Vcon is substantially equal to the output terminal potential of the operational amplifier 61.

In the embodiment, the operational amplifier 61, the PMOS transistor 62, and the resistor 63 constitute the feedback control circuit. Accordingly, a current flowing through the resistor 63 is not depended on the power source voltage VDD, and is determined only by the reference voltage Vref and the resistivity Rref of the resistor 63. The gate potential of the PMOS transistor 52 and 62 is equal to the control potential Vcon, and the PMOS transistor 52 and 62 have the same source potential. Accordingly, the PMOS transistors 52 and 62 have the same voltage between the gate terminals and the source terminals thereof, and have the current-mirror relationship.

As a result, it is possible to adjust a drain current of the PMOS transistors 52 and 62 according to the reference voltage Vref, thereby making it possible to control a drive current of the LED element LED1 of the LED array 42 at a specific value. Further, the PMOS transistor 53 is turned on to drive according to the print data latched with the latch circuit 43. At this moment, the drain current generated in the PMOS transistor 53 is dependent on the voltage between the gate terminals and the source terminals of the PMOS transistors 52 and 62. Accordingly, the PMOS transistor 53 functions as the switching element for switching the drain current.

When the LED element is instructed to stop emitting light, the strobe signal STB-N becomes the low level. At this moment, the PMOS transistor 161 is turned on, and the NMOS transistor 162 is turned off. Accordingly, the control potential Vcon is substantially equal to the power source potential VDD. As a result, the PMOS transistor 52 is turned off, thereby generating no drive current of the LED element LED1.

Figure 16:
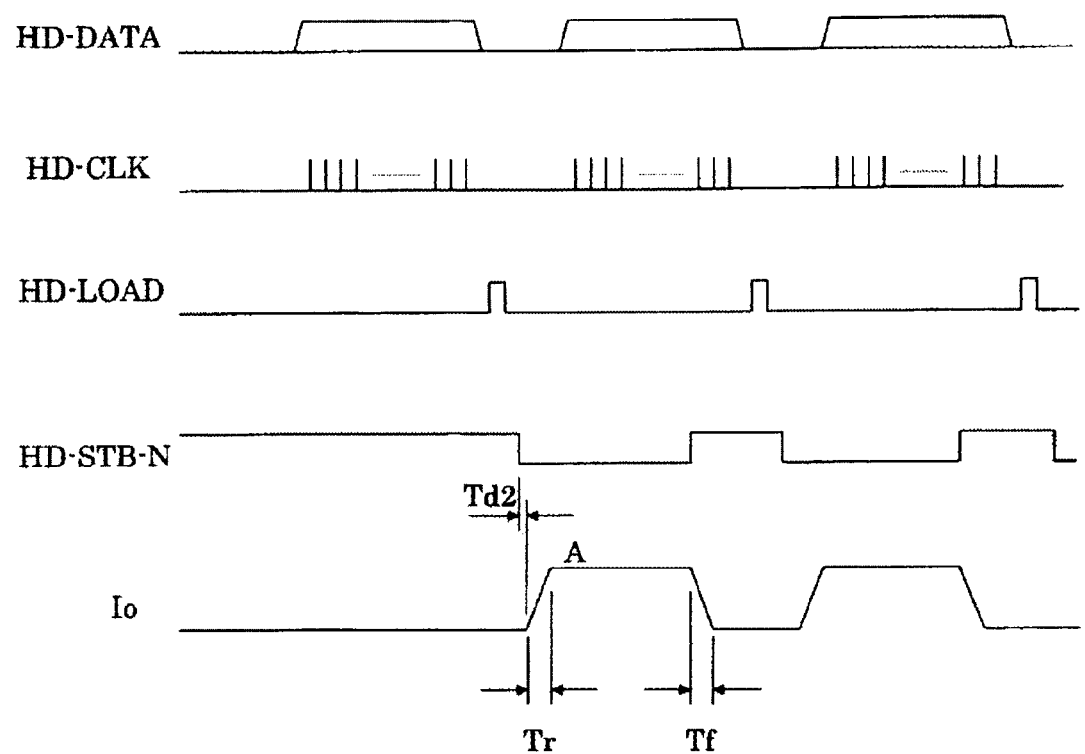
FIG. 16 is a time chart showing an operation of a drive circuit according to the fourth embodiment of the present invention.

An operation of the driver IC 128 will be explained next. FIG. 16 is a time chart showing the operation of the drive circuit according to the fourth embodiment of the present invention. As shown in FIG. 16, when the signal HD-DATA and the signal HD-CLK are input, the print data is shift input to the shift register 31 shown in FIG. 2, and the HD-DATA signal pulse is input, the data temporarily stored in the shift register 31 are latch stored in the latch circuit 32. When the strobe signal HD-STB-N is input and rises, the LED drive current $I_0$ rises after the time Td2. When the strobe signal HD-STB-N rises for the LED drive off, the LED drive current $I_0$ falls.

As compared with the waveform in the conventional drive circuit shown in FIG. 20, in the embodiment as shown in FIG. 16, when the LED drive current $I_0$ rises, an overshoot at the point A in the waveform in the conventional drive circuit does not occur.

Further, as compared with the time charts in the first and third embodiments shown in FIGS. 9 and 13, the delay time from when the strobe signal HD-STB-N rises to when the LED drive current starts rising decreases. The delay time Td2 shown in FIG. 16 is smaller than the delay time Td1 shown in FIG. 9 (Td2<Td1), indicating that the response becomes quicker relative to the LED drive instruction signal.

The rise time Tr and the fall time Tf of the LED drive current $I_0$ are shown in FIG. 16. The rise time Tr and the fall time Tf are referred to as the transition time Tt. The transition time Tt is determined mainly by a total value Co of a gate capacitance of the PMOS transistor 52, an on resistivity Rp of the PMOS transistor 161, and an on resistivity Rn of the NMOS transistor 162. The rise time Tr and the fall time Tf of the LED drive current $I_0$ are given by:

$$Tr \approx Rn \times Co$$

$$Tf \approx Rp \times Co$$

In the embodiment, it is possible to arbitrarily set the transition time Tt at a desirable level, for example, 100 nS to 200 nS, similar to those in the first to third embodiments. The conventional drive circuit has the LED drive current with the rise time of few tens nS. Accordingly, in the embodiment, the rise time becomes larger ten hold, thereby reducing the noise voltage generated with the switching of the LED current to one tenth.

As described above, in the embodiment, the PMOS transistor 161 and the NMOS transistor 162 are connected to the output terminal of the operational amplifier 61 for switching the gate signal of the PMOS transistor 52 between on and off. Accordingly, it is possible to switch the LED drive current within a desirable transition time through properly adjusting the on resistivity of the PMOS transistor 161 and the NMOS transistor 162.

As described above, in the embodiment, the PMOS transistor 161 and the NMOS transistor 162 are configured such that the output potential Vcon of the operational amplifier 61 becomes substantially equal to the power source potential VDD when the LED drive is turned off. Accordingly, when the LED element is not driven, the output potential of the operational amplifier 122 output to the gate terminal of the PMOS transistor 52 becomes equal to the power source potential VDD. Accordingly, when the LED element is turned off, the parasite capacitor connected to the drain terminal of the PMOS transistor 52 as the equivalent circuit is not charged.

As a result, when the LED element is turned off, the parasite capacitor connected to the drain terminal of the PMOS transistor 52 as the equivalent circuit is not charged. Accordingly, when the LED element is turned on, the charges accumulated in the parasite capacitor are not rapidly discharged through the PMOS transistor 53 and the LED element, thereby preventing the overshoot of the drive current.

Further, in the embodiment, when the PMOS transistor 52 is turned off, the first PMOS transistor 53 is switched between on and off. Accordingly, when the PMOS transistor 53 is switched between on and off, the drive current does not change rapidly, thereby preventing malfunction of the drive circuit due to the noise voltage.

Further, in the embodiment, it is possible to switch the LED drive current within a desirable transition time through properly adjusting the on resistivity of the PMOS transistor 161 and the NMOS transistor 162 for switching the gate signal of the PMOS transistor 52 between on and off. Accordingly, it is possible to turn on and off the LED drive at a desirable switching speed while restricting the noise voltage accompanied with the switching.

Modified Example No. 1 of Fourth Embodiment

Figure 17:
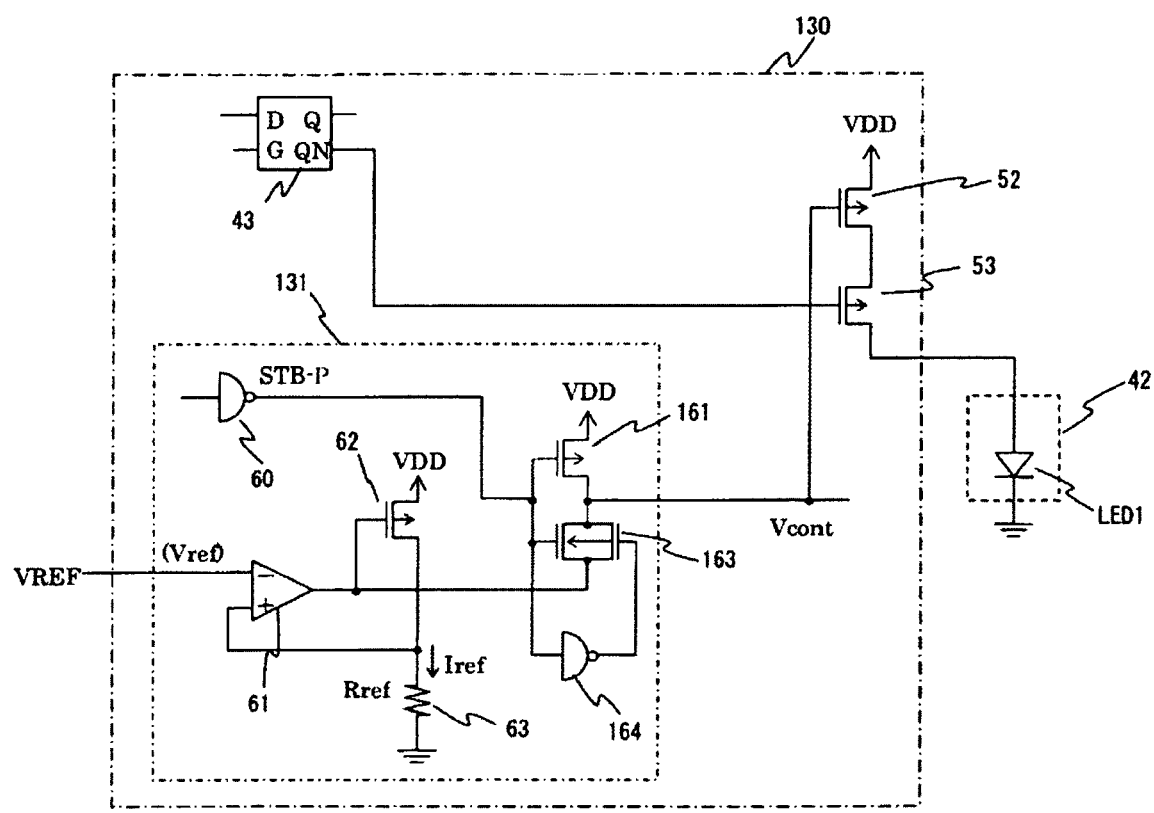
FIG. 17 is a circuit diagram showing a modified example No. 1 of the driver IC according to the fourth embodiment of the present invention.

A modified example No. 1 of the fourth embodiment will be explained next. FIG. 17 is a circuit diagram showing a modified example No. 1 of a driver IC 130 according to the fourth embodiment of the present invention. A connection relationship between the LED drive circuit and a peripheral circuit thereof is shown in FIG. 17. In FIG. 17, the dot 1 (for example, a surrounding area of the drive circuit of the LED 1) is shown as an example.

In the modified example No. 1 of the fourth embodiment, the driver IC 130 includes a control voltage generation circuit 131 having a configuration different from that of the control voltage generation circuit 129 in the fourth embodiment. Other similar elements are designated with the same reference numerals.

As shown in FIG. 17, the driver IC 130 includes the control voltage generation circuit 131. The control voltage generation circuit 131 includes the operational amplifier 61 having the output potential Vcon. The resistor 63 has the resistivity of Rref. The PMOS transistor 62 has a gate length the same as that of the PMOS transistor 55. The reference voltage VREF generated in the reference voltage generation circuit 35 is input to the reverse input terminal of the operational amplifier 61.

In the embodiment, the driver IC 130 further includes the inverter circuit 60. The signal STB-N (not shown in FIG. 17) having logic the same as that of the strobe signal HD-STB-N of the LED head 19 is input to the input terminal of the inverter circuit 60. The inverter circuit 60 outputs the output signal STB-P. The source terminal of the PMOS transistor 62 is connected to the power source VDD, the gate terminal thereof is connected to the output terminal of the operational amplifier 61, and the drain terminal thereof is connected to one end portion of the resistor 63 and the non-reverse input terminal of the operational amplifier 61. The other end portion of the resistor 63 is connected to ground.

In the embodiment, the driver IC 130 further includes the PMOS transistor 161 and an analog switch circuit 163. The analog switch circuit 163 is formed of PMOS transistors having first terminals and second terminals connected to with each other. The source terminal of the PMOS transistor 161 is connected to the power source VDD, and the drain terminal thereof is connected to the first terminal of the analog switch circuit 163, and further connected to the gate terminal of the PMOS transistor 52 as the control potential Vcon.

In the embodiment, the second terminal of the analog switch circuit 163 is connected to the output terminal of the operational amplifier 61. The gate terminal of the PMOS transistor 161 is connected to a gate terminal of the NMOS side transistor of the analog switch circuit 163, and further connected to the output terminal of the inverter circuit 60. The input terminal of the inverter circuit 60 is connected to a gate terminal of the PMOS side transistor of the analog switch circuit 163.

When the LED element is instructed to emit light, the strobe signal STB-N becomes the high level. At this moment, the PMOS transistor 161 is turned off, and the analog switch circuit 163 is turned on. Accordingly, the control potential Vcon is substantially equal to the output terminal potential of the operational amplifier 61.

In the embodiment, the operational amplifier 61, the PMOS transistor 62, and the resistor 63 constitute the feedback control circuit. Accordingly, a current flowing through the resistor 63 is not depended on the power source voltage VDD, and is determined only by the reference voltage Vref and the resistivity Rref of the resistor 63. The gate potential of the PMOS transistor 52 and 62 is equal to the control potential Vcon, and the PMOS transistor 52 and 62 have the same source potential. Accordingly, the PMOS transistors 52 and 62 have the same voltage between the gate terminals and the source terminals thereof, and have the current-mirror relationship.

As a result, it is possible to adjust the drain current of the PMOS transistors 52 and 62 according to the reference voltage Vref, thereby making it possible to control a drive current of the LED element LED1 of the LED array 42 at a specific value. Further, the PMOS transistor 53 is turned on to drive according to the print data latched with the latch circuit 43. At this moment, the drain current generated in the PMOS transistor 53 is dependent on the voltage between the gate terminals and the source terminals of the PMOS transistors 52 and 62. Accordingly, the PMOS transistor 53 functions as the switching element for switching the drain current.

When the LED element is instructed to stop emitting light, the strobe signal STB-N becomes the low level. At this moment, the PMOS transistor 161 is turned on, and the analog switch circuit 163 is turned off. Accordingly, the control potential Vcon is substantially equal to the power source potential VDD. As a result, the PMOS transistor 52 is turned off, thereby generating no drive current of the LED element LED1.

As described above, in the modified example No. 1, the NMOS transistor 162 in the control voltage generation circuit 129 in the fourth embodiment is replaced with the analog switch circuit 163. In the fourth embodiment shown in FIG. 15, when a difference between the output potential of the operational amplifier 61 and the power source potential VDD is small, even though the on instruction signal STB-P is applied to the gate terminal of the NMOS transistor 162, the NMOS transistor 162 may not be turned on due to an insufficient voltage between the gate terminal and the source terminal thereof. On the other hand, in the modified example No. 1 shown in FIG. 17, even though the NMOS side transistor of the analog switch circuit 163 is not sufficiently turned on, the PMOS side transistor of the analog switch circuit 163 is securely turned on, thereby obtaining the secure circuit operation.

Modified Example No. 2 of Fourth Embodiment

Figure 18:
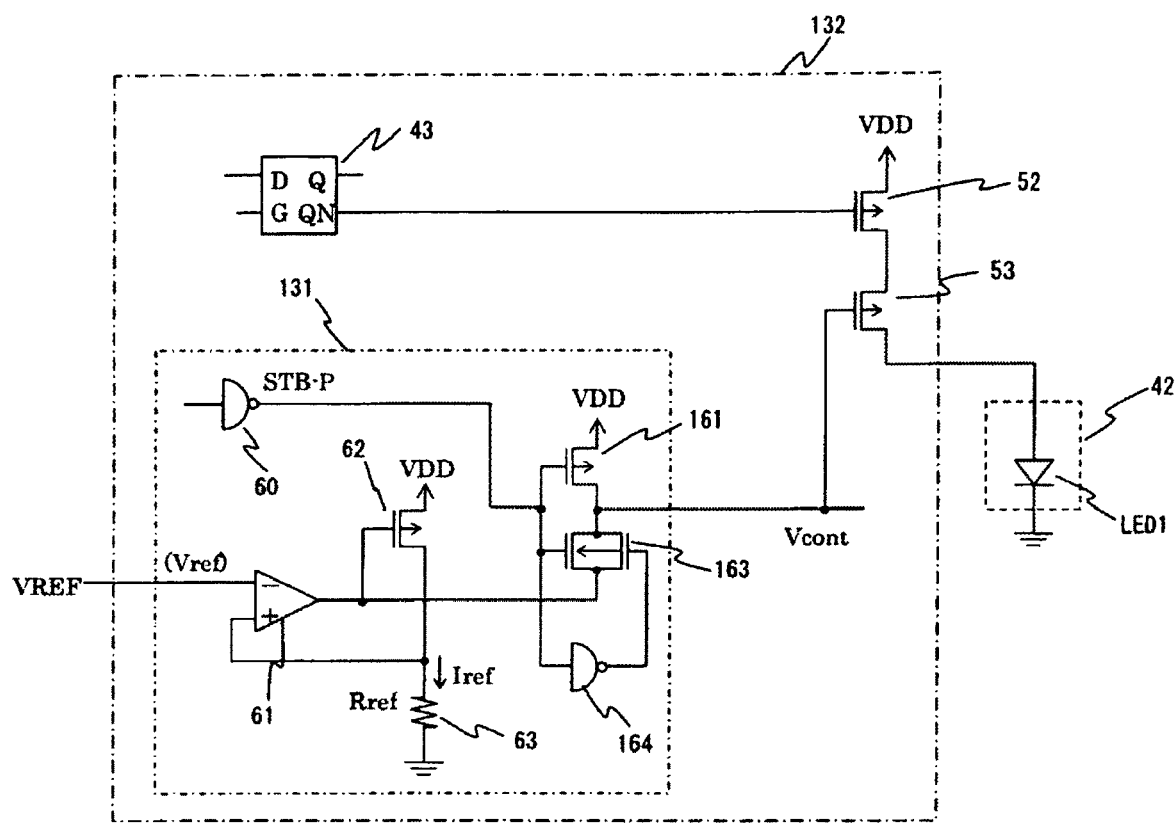
FIG. 18 is a circuit diagram showing a modified example No. 2 of the driver IC according to the fourth embodiment of the present invention.
Figure 19:
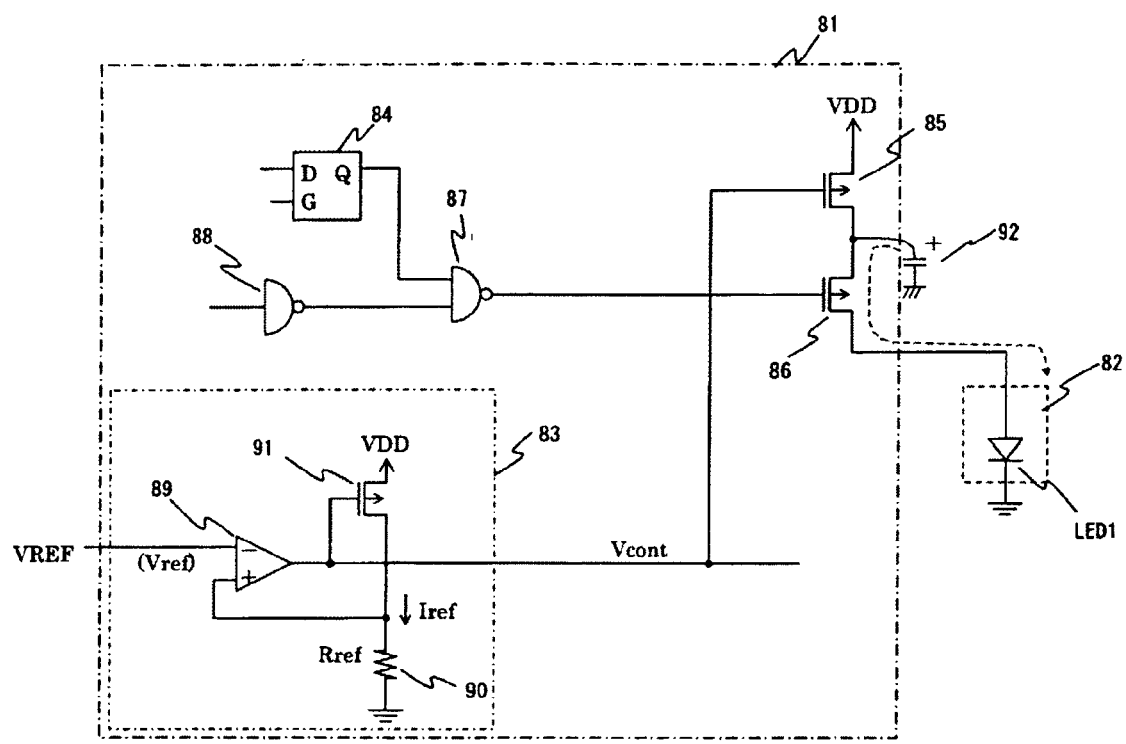
FIG. 19 is a circuit diagram showing a conventional drive circuit.

A modified example No. 2 of the fourth embodiment will be explained next. FIG. 18 is a circuit diagram showing a modified example No. 2 of a driver IC 132 according to the fourth embodiment of the present invention. A connection relationship between the LED drive circuit and a peripheral circuit thereof is shown in FIG. 18. In FIG. 18, the dot 1 (for example, a surrounding area of the drive circuit of the LED 1) is shown as an example.

In the modified example No. 2 of the fourth embodiment, the LED drive circuit includes the LED drive element having a configuration different from that of the LED drive circuit in the fourth embodiment. More specifically, in the modified example No. 2 of the fourth embodiment, the connections of the gate terminals of the first transistor and the second transistor are exchanged. Other similar elements are designated with the same reference numerals.

As shown in FIG. 18, the driver IC 132 includes the control voltage generation circuit 131. The control voltage generation circuit 131 has the configuration similar to that in the modified example No. 1, and an explanation thereof is omitted. The source terminal of the PMOS transistor 52 is connected to the power source VDD, and the drain terminal thereof is connected to the source terminal of the PMOS transistor 53. The drain terminal of the PMOS transistor 53 is connected to the output terminal of the driver IC 132, and further connected to the anode terminal of the LED element LED1 of the LED array 42.

In the modified example No. 2, the input terminal D of the latch circuit 43 is connected to the output terminal of the shift register (corresponding to the shift register 31 shown in FIG. 2), and the input terminal G thereof is connected to the latch signal HD-LOAD. The output terminal QN of the latch circuit 43 is connected to the gate terminal of the PMOS transistor 53. Further, the gate terminal of the PMOS transistor 53 is connected to the output terminal Vcont of the control voltage generation circuit 131.

In the modified example No. 2, when the LED element LED1 is instructed to emit light, the print data is stored in the latch circuit 43. At this moment, an output from the QN terminal of the latch circuit 43 becomes the low level, and the POMS transistor 52 is turned on. Then, the STB-P signal in the control voltage generation circuit 131 becomes the high level, the PMOS transistor 161 is turned on, and the analog switch circuit 164 is turned on. As a result, the control voltage Vcon becomes substantially equal to the output terminal potential of the operational amplifier 61.

In the modified example No. 2, the operational amplifier 61, the PMOS transistor 62, and the resistor 63 constitute the feedback control circuit. Accordingly, the current flowing through the resistor 63 is not depended on the power source voltage VDD, and is determined only by the reference voltage Vref and the resistivity Rref of the resistor 63. As described above, the PMOS transistor 52 is turned on. Accordingly, the PMOS transistors 53 and 62 have the same voltage between the gate terminals and the source terminals thereof, and have a current-mirror relationship.

As a result, it is possible to adjust the drain current of the PMOS transistors 53 and 62 according to the reference voltage Vref, thereby making it possible to control a drive current of the LED element LED1 of the LED array 42 at a specific value. At this moment, the drain current generated in the PMOS transistor 53 is dependent on the voltage between the gate terminal and the source terminal of the PMOS transistor 62. Accordingly, the PMOS transistor 52 functions as a switching element for switching the drain current.

In the modified example No. 2, when the LED element LED1 is instructed to stop emitting light, the POMS transistor 52 is turned on, the PMOS transistor 161 is turned off, and the analog switch circuit 164 is turned off. As a result, the control voltage Vcon becomes substantially equal to the power source potential VDD. Accordingly, the PMOS transistor 53 is turned off, thereby not generating the drive current of the LED element LED1.

As described above, as compared with the modified example No. 1, in the modified example No. 2 of the fourth embodiment, the connections of the gate terminals of the first transistor and the second transistor are exchanged. It is possible to obtain the same effects in the modified example No. 1 and the fourth embodiment.

As described above, in the first to fourth embodiments, the drive circuit is adopted in the LED head of the electro-photography printer using the LED elements as the light source. The drive circuit is applicable to an organic LED head using an organic LED element as the light source. Further, the drive circuit is applicable to an array of heating resistors disposed in a thermal printer and an array of display units disposed in a display device.

The disclosure of Japanese Patent Application No. 2007-079252, filed on Mar. 25, 2008, is incorporated in the application by reference.

While the invention has been explained with reference to the specific embodiments of the invention, the explanation is illustrative and the invention is limited only by the appended claims.

What is claimed is:

1. A drive circuit comprising:
a drive element for supplying a drive current to a driven element;
a control voltage generation circuit for outputting a control voltage to the drive element to generate the drive current through inputting a reference voltage; and
a first switch section for shutting down the reference voltage when the driven element is not driven so that the control voltage decreases to a level not to generate the drive current.

2. The drive circuit according to claim 1, wherein said first switch section is formed of an analog switch circuit disposed in the control voltage generation circuit.

3. The drive circuit according to claim 1, wherein said control voltage generation circuit includes an operational amplifier having an input terminal connected to the reference voltage through the first switch section, said input terminal being connected to ground through a second switch section turned on when the driven element is not driven.

4. The drive circuit according to claim 1, wherein said control voltage generation circuit includes an operational amplifier having two input terminals, one of said two input terminals being connected to the reference voltage through the first switch section, said first switch section including a first switch portion connected to the one of the two input terminals in parallel and a second switch portion connected to the other of the two input terminals in parallel.

5. The drive circuit according to claim 1, wherein said control voltage generation circuit includes an operational amplifier for outputting the control voltage, said first switch section including a first transistor connected to a power source and a second transistor connected to the first transistor and an output portion of the operational amplifier.

6. The drive circuit according to claim 1, wherein said control voltage generation circuit includes an operational amplifier for outputting the control voltage, said first switch section including a transistor connected to a power source and an analog switch connected to the transistor and an output portion of the operational amplifier.

7. An LED (Light Emitting Diode) head comprising the drive circuit according to claim 1.

8. An image forming apparatus comprising the drive circuit according to claim 1.

9. A drive circuit comprising:
a drive element for supplying a drive current to a driven element;
a setting circuit for setting the drive current in the drive element through flowing a reference voltage substantially proportional to the drive current; and
a switch section for shutting down the reference voltage when the driven element is not driven.

10. An LED (Light Emitting Diode) head comprising the drive circuit according to claim 9.

11. The drive circuit according to claim 9, wherein said drive element is formed of a drive transistor, said setting circuit including a transistor constituting a current-mirror relationship with the drive transistor, said transistor being connected to ground through the switch section.

12. An image forming apparatus comprising the drive circuit according to claim 9.

* * * * *